(12) United States Patent
Jo et al.

(10) Patent No.: US 11,683,964 B2
(45) Date of Patent: Jun. 20, 2023

(54) ORGANIC LIGHT EMITTING DIODE DISPLAY HAVING ELECTRODE STRUCTURE FOR IMPROVED DISPLAY QUALITY

(71) Applicant: Samsung Display Co., LTD., Yongin-si (KR)

(72) Inventors: Kang Moon Jo, Hwaseong-si (KR); Chong Chui Chai, Seoul (KR); Jun Hyun Park, Suwon-si (KR); An Su Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 382 days.

(21) Appl. No.: 16/988,984

(22) Filed: Aug. 10, 2020

(65) Prior Publication Data

US 2021/0126079 A1    Apr. 29, 2021

(30) Foreign Application Priority Data

Oct. 28, 2019   (KR) ........................ 10-2019-0134476

(51) Int. Cl.
```
H01L 27/14     (2006.01)
H01L 27/32     (2006.01)
G09G 3/3208    (2016.01)
H01L 27/12     (2006.01)
H01L 51/52     (2006.01)
```

(52) U.S. Cl.
CPC ....... *H01L 27/3276* (2013.01); *G09G 3/3208* (2013.01); *H01L 27/1255* (2013.01); *H01L 27/3262* (2013.01); *H01L 27/3265* (2013.01); *H01L 51/52* (2013.01); *H01L 51/5203* (2013.01)

(58) Field of Classification Search
CPC ............. H01L 27/3276; H01L 27/1255; H01L 27/3262; H01L 27/3265; H01L 51/5203; G09G 3/3208
USPC ......................................................... 257/72
See application file for complete search history.

(56) References Cited

U.S. PATENT DOCUMENTS

| | | | | |
|---|---|---|---|---|
| 2017/0287938 A1* | 10/2017 | Lee | .................. | H01L 23/535 |
| 2018/0102400 A1* | 4/2018 | Choi | .................. | H01L 27/3216 |
| 2019/0157362 A1* | 5/2019 | Rho | .................. | H01L 51/5209 |

FOREIGN PATENT DOCUMENTS

| KR | 1020150066981 | 6/2015 |
|---|---|---|
| KR | 1020170114026 | 10/2017 |

* cited by examiner

*Primary Examiner* — Phuc T Dang
(74) *Attorney, Agent, or Firm* — Cantor Colburn LLP

(57) ABSTRACT

An organic light emitting diode display includes a substrate, a semiconductor pattern disposed on the substrate, a first conductive layer disposed on the semiconductor pattern and including a first gate electrode having an island-shaped structure, a second gate electrode having an island-shaped structure, and a third gate electrode having an island-shaped structure, and a second conductive layer disposed on the first conductive layer and including a first initialization voltage line overlapping the first gate electrode, a scan line overlapping the second gate electrode, and a control signal line overlapping the third gate electrode, where the control signal line is electrically connected to the third gate electrode, the scan line is electrically connected to the second gate electrode, and the first initialization voltage line, the scan line, and the control signal line extend in a first direction.

19 Claims, 30 Drawing Sheets

ORGANIC LIGHT EMITTING DIODE DISPLAY HAVING ELECTRODE STRUCTURE FOR IMPROVED DISPLAY QUALITY

This application claims priority to Korean Patent Application No. 10-2019-0134476, filed on Oct. 28, 2019, and all the benefits accruing therefrom under 35 U.S.C. § 119, the content of which in its entirety is herein incorporated by reference.

BACKGROUND

1. Field

Embodiments of the invention relate to an organic light emitting diode display, and more particularly, to an organic light emitting diode display and a manufacturing thereof, where a data voltage is transferred into a pixel by an input capacitor.

2. Description of the Related Art

As a display device for displaying an image, an organic light emitting diode display has been attracting attention.

The organic light emitting diode display has a self-luminous property, and, unlike a liquid crystal display device, does not desire a separate light source, thereby reducing a thickness and a weight thereof. In addition, the organic light emitting diode display exhibits high quality characteristics such as low power consumption, high luminance, and high response speed.

SUMMARY

An organic light emitting diode display has a further complicated pixel structure than that of a liquid crystal display, and it is difficult to provide a space for forming pixels as a resolution becomes higher.

Embodiments provide an organic light emitting display device capable of receiving data voltages with high efficiency when data voltages are transferred into a pixel using an input capacitor. In addition, the embodiments provide an organic light emitting display device having improved display quality because an anode voltage of an organic light emitting diode has little variation even when a data voltage flowing through a data line is changed.

An embodiment of an organic light emitting diode display includes a substrate, a semiconductor pattern disposed on the substrate, a first conductive layer disposed on the semiconductor pattern and including a first gate electrode having an island-shaped structure, a second gate electrode having an island-shaped structure, and a third gate electrode having an island-shaped structure, and a second conductive layer disposed on the first conductive layer and including a first initialization voltage line overlapping the first gate electrode, a scan line overlapping the second gate electrode, and a control signal line overlapping the third gate electrode, where the control signal line is electrically connected to the third gate electrode, the scan line is electrically connected to the second gate electrode, and the first initialization voltage line, the scan line, and the control signal line extend in a first direction.

In another embodiment, a third conductive layer disposed on the second conductive layer and including a data line extending in a second direction crossing the first direction, and a fourth conductive layer disposed on the third conductive layer and includes a first driving voltage line and a second initialization voltage line extending in the second direction, may be further included.

In another embodiment, the second conductive layer may further include a connecting member, the semiconductor pattern may include a storage capacitor connection semiconductor and the connecting member may electrically connect the storage capacitor connection semiconductor of the semiconductor pattern and the first gate electrode.

In another embodiment, the semiconductor pattern may further include a lightly doped region, a heavily doped region, and a non-doped region, and the connecting member may be in contact with the lightly doped region and the heavily doped region of the semiconductor pattern.

In another embodiment, the fourth conductive layer may further include a first electrode for the input capacitor, the data line may include an expansion part, and the first electrode for the input capacitor may overlap the expansion part of the data line to form the input capacitor.

In another embodiment, the semiconductor pattern further includes a data voltage input semiconductor, and the first electrode for the input capacitor may be connected to the data voltage input semiconductor of the semiconductor pattern.

In another embodiment, the fourth conductive layer may further include an anode electrode connecting member, the semiconductor pattern may include an anode electrode connection semiconductor and the anode electrode connecting member may be connected to the anode electrode connection semiconductor of the semiconductor pattern downward and an anode electrode upward.

In another embodiment, the first initialization voltage line and the second initialization voltage line may be electrically connected to each other.

In another embodiment, the first gate electrode and the first initialization voltage line may overlap to form a storage capacitor.

In another embodiment, the semiconductor pattern may include a heavily doped region which does not overlap the first conductive layer, and a non-doped region overlapping the first conductive layer.

In another embodiment, a lightly doped region may be disposed between the heavily doped region and the non-doped region, and the lightly doped region and the heavily doped region have an n-type material.

In another embodiment, the semiconductor pattern may have a symmetrical structure with reference to the second direction, and a unit semiconductor pattern may correspond to two pixels.

In another embodiment, the unit semiconductor pattern may have one first driving voltage input semiconductor, the first driving voltage input semiconductor may be connected to the first driving voltage line, and the first driving voltage line may have a structure in which two adjacent pixel columns are shared.

An embodiment of an organic light emitting diode display includes an organic light emitting element, a first transistor supplying a current to the organic light emitting element, a storage capacitor connected to a gate electrode of the first transistor, a second transistor and a third transistor connecting the organic light emitting element and the gate electrode of the first transistor, a data line including an expansion part, an input capacitor transmitting a data voltage from the data line between the second transistor and the third transistor, and a first electrode for the input capacitor, where the input capacitor is provided by the expansion part of the data line as a first input capacitor electrode and the first electrode for the input capacitor disposed on the expansion part of the data line and overlapping the expansion part of the data line as a second input capacitor electrode.

In another embodiment, a storage capacitor provided by the gate electrode of the first transistor as a first storage capacitor electrode and a first initialization voltage line to which an initialization voltage is applied as a second storage capacitor electrode may be further included.

In another embodiment, a gate electrode of the second transistor may receive a scan signal, a gate electrode of the third transistor may receive a control signal, the first electrode of the first transistor may receive a first driving voltage, and a cathode of the organic light emitting element may receive a second driving voltage.

In another embodiment, an initialization period, a threshold voltage compensation period, a programming period, and a light emission period may be included, and the second transistor and the third transistor may be turned on in the initialization period and the threshold voltage compensation period.

In another embodiment, the first driving voltage may include a high voltage having a high voltage value, a first low voltage having a first low voltage value, and a second low voltage having a second low voltage value that is lower than the first low voltage value, the first low voltage may be applied as the first driving voltage in the initialization period, the second low voltage may be applied as the first driving voltage in the threshold voltage compensation period, and the high voltage may be applied as the first driving voltage in the programming period and the light emission period.

In another embodiment, the initialization voltage may include a low voltage and a high voltage, and the initialization voltage may be changed from the low voltage to the high voltage and starts in the light emission period.

In another embodiment, the low voltage may be applied as the initialization voltage in the threshold voltage compensation period.

By the embodiments, the size of the input capacitor electrode disposed above the data line may be sufficiently large, thereby receiving the data voltage into the pixel with high efficiency. In addition, as the data voltage flowing through the data line is changed, the anode voltage does not fluctuate or is less fluctuated, thereby improving the display quality.

BRIEF DESCRIPTION OF THE DRAWINGS

The above and other embodiments, advantages and features of this disclosure will become more apparent by describing in further detail embodiments thereof with reference to the accompanying drawings, in which.

DETAILED DESCRIPTION

Figure 1:
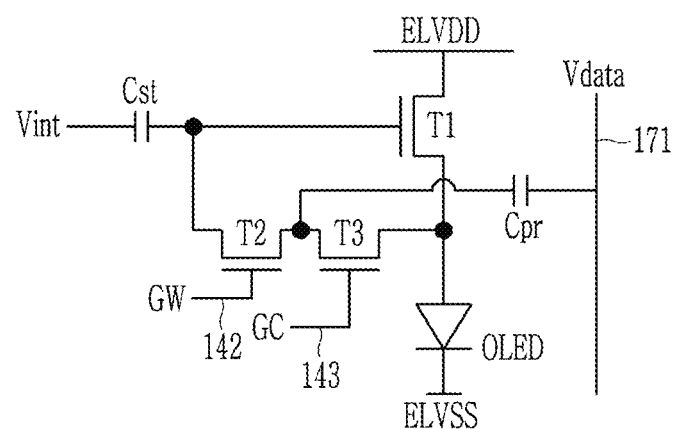
FIG. 1 is an equivalent circuit diagram of an embodiment of one pixel of an organic light emitting diode display.

The invention will be described more fully hereinafter with reference to the accompanying drawings, in which embodiments of the invention are shown. As those skilled in the art would realize, the described embodiments may be modified in various different ways, all without departing from the spirit or scope of the invention.

In order to clearly explain the invention, a portion that is not directly related to the invention was omitted, and the same reference numerals are attached to the same or similar constituent elements through the entire specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Further, throughout the specification, the word "in a plan view" means viewing a target portion from the top, and the word "in a cross-section" means viewing a cross-section provided by vertically cutting a target portion from the side.

Now, one pixel of an organic light emitting diode display in an embodiment is described with reference to FIGS. 1 and 2.

Figure 2:
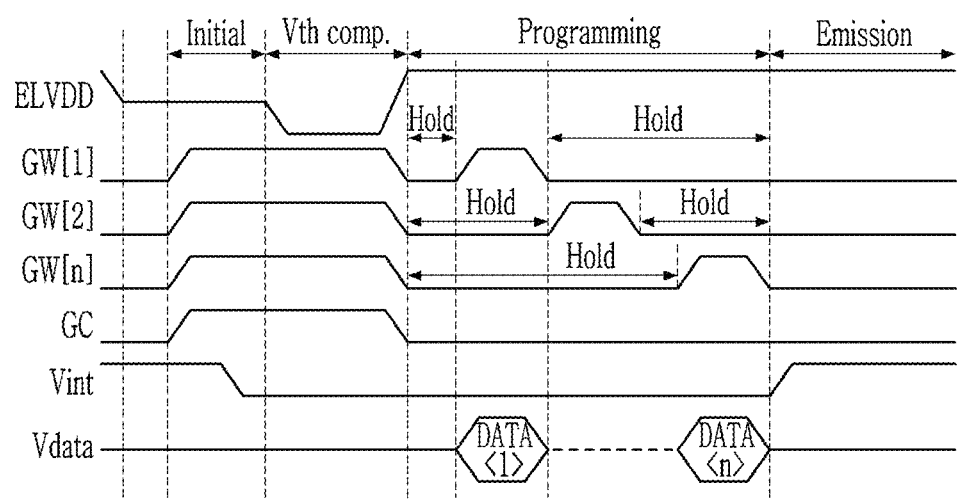
FIG. 2 is a timing diagram of a signal applied to a pixel of FIG. 1.

FIG. 1 is an equivalent circuit diagram of an embodiment of one pixel of an organic light emitting diode display, and FIG. 2 is a timing diagram of a signal applied to a pixel of FIG. 1.

A pixel of an organic light emitting diode display in an embodiment includes three transistors T1, T2, and T3, two capacitors Cst and Cpr, and an organic light emitting element (e.g., organic light emitting diode ("OLED")). The transistors T1, T2, and T3 of an embodiment of FIG. 1 may be n-type transistors which are turned on when a voltage applied to a gate electrode is a high voltage. However, the invention is not limited thereto, and in another embodiment, at least some of the transistors T1, T2, and T3 may be p-type transistors.

The driving transistor T1 is a transistor in which a voltage applied to a gate electrode is changed depending on a data voltage Vdata, and accordingly, an output current is transmitted to the organic light emitting diode OLED. The gate electrode of the driving transistor T1 is connected to the storage capacitor Cst, a driving voltage ELVDD (hereinafter also referred to as a first driving voltage) is applied to the first electrode, and an anode of the organic light emitting diode OLED is connected to the second electrode of the driving transistor T1.

The anode of the organic light emitting diode OLED is connected to the second electrode of the driving transistor T1, and a second driving voltage ELVSS is applied to a cathode of the organic light emitting diode OLED.

Also, a second transistor T2 and a third transistor T3 are connected between the gate electrode of the driving transistor T1 and the second electrode of the driving transistor T1. The input capacitor Cpr is connected to a middle terminal to which the second transistor T2 and the third transistor T3 are connected. Hereinafter, the middle terminal of the second transistor T2 and the third transistor T3 to which the input capacitor Cpr is connected is also referred to as a data voltage input terminal.

First, the second transistor T2 is described.

The second transistor T2 is disposed between the gate electrode of the driving transistor T1 and a data voltage input terminal. The first electrode of the second transistor T2 is connected to the data voltage input terminal to receive the data voltage and is connected to the third transistor T3, and the second electrode is connected to the gate electrode of the driving transistor T1 and the storage capacitor Cst. The gate electrode of the second transistor T2 is connected to a scan line 142 such that a turn-on voltage is sequentially applied depending on a scan signal GW during a programming period and the turn-on voltage is applied during an initialization period and a threshold voltage compensation period.

The third transistor T3 is disposed between the second electrode of the driving transistor T1 and the data voltage input terminal. The first electrode of the third transistor T3 is connected to the second electrode of the driving transistor T1 and the anode of the organic light emitting diode OLED, and the second electrode is connected to the data voltage input terminal to be connected to the first electrode of the second transistor T2. The gate electrode of the third transistor T3 is connected to a control signal line 143. The turn-on voltage is applied as the control signal GC applied to the control signal line 143 during the initialization period and the threshold voltage compensation period.

In the programming period, the second transistor T2 transmits the data voltage input through the input capacitor Cpr to the gate electrode of the driving transistor T1, and in the initialization period and the threshold voltage compensation period, the second transistor T2 and the third transistor T3 operate together to initialize the voltage of the anode electrode of the organic light emitting diode OLED and the voltage of the gate electrode of the driving transistor T1 and to allow the threshold voltage to be stored in the storage capacitor Cst.

The storage capacitor Cst stores and maintains the data voltage transmitted to the gate electrode of the driving transistor T1 through the second transistor T2. The first electrode of the storage capacitor Cst is connected to the gate electrode of the driving transistor T1 and the second electrode of the second transistor T2, and an initialization voltage Vint is applied to the second electrode of the storage capacitor Cst.

A data line 171 is connected to the data voltage input terminal by the input capacitor Cpr. That is, the first electrode of the input capacitor Cpr is connected to the data voltage input terminal, and the second electrode of the input capacitor Cpr is connected to the data line 171. As a result, as the voltage of the data line 171 is changed, the voltage of the data voltage input terminal is changed and the second transistor T2 is turned on such that the data voltage of the corresponding pixel is transmitted to the gate electrode of the driving transistor T1. At this time, since the change amount of the voltage generated at the data voltage input terminal is transmitted through the input capacitor Cpr, the change amount of the voltage generated at the data voltage input terminal may be reduced and transmitted rather than having the change amount of the voltage generated at the data line 171. That is, although a voltage value that is lower than the data voltage Vdata applied to the data line 171 may be transmitted to the data voltage input terminal, for convenience, an expression "the data voltage" is also used for the voltage transferred to the data voltage input terminal. As a result, the voltage transmitted to the data voltage input terminal as well as the voltage applied to the data line 171 may be referred to as the data voltage Vdata, for convenience. However, for the sake of clarity, the data voltage Vdata of the data line 171 and the data voltage of the data voltage input terminal may be distinguished from each other. Further, the data voltage of the data voltage input terminal may also be referred to as a data voltage transferred through the input capacitor Cpr. Even when the data voltage transmitted to the data voltage input terminal is transmitted to the gate electrode of the driving transistor T1 and the storage capacitor Cst through the second transistor T2, the expression "the data voltage" is used for convenience. For the sake of clarity, the data voltage of the gate electrode of the driving transistor T1 or the data voltage stored in the storage capacitor Cst may refer to the voltage of the data voltage input terminal transmitted to the gate electrode of the driving transistor T1 and the storage capacitor Cst through the second transistor T2.

Next, the operation according to the applied signal with respect to the pixel like in FIG. 1 is described based on FIG. 2.

The pixel of the organic light emitting diode display in an embodiment is operated in periods classified into an initialization period (Initial), a threshold voltage compensation period (Vth Comp.), a programming period (Programming), and a light emission period (Emission).

The organic light emitting diode OLED, which emits light during the light emission period, finishes the light emission period while the first driving voltage ELVDD applied to the first electrode of the driving transistor T1 is changed from the high voltage to the first low voltage. At this time, the first low voltage is applied to the cathode of the organic light emitting diode OLED and is smaller than or equal to the voltage value of the second driving voltage ELVSS, so that the current does not flow in a forward direction in the organic light emitting diode OLED. As a result, the light emission period ends. In an embodiment, the first low voltage of the first driving voltage ELVDD may have a value that is slightly greater than the second driving voltage ELVSS, but the voltage of the anode of the organic light emitting diode OLED has a voltage value that is not greater than the voltage of the cathode to end the light emission period.

Thereafter, the organic light emitting diode OLED enters the initialization period. The initialization period (Initial) starts while the scan signal GW applied to the scan line 142 and the control signal GC applied to the control signal line 143 are respectively changed into the high voltage (a turn-on voltage). The second transistor T2 and the third transistor T3 are turned on by the scan signal GW and the control signal GC to which the turn-on voltage is applied, and the anode (including the second electrode of the driving transistor T1) of the organic light emitting diode OLED, the first electrode of the input capacitor Cpr, and the first electrode (including the gate electrode of the driving transistor T1) of the storage capacitor Cst are connected to each other so that a voltage of the anode of the organic light emitting diode OLED, a voltage of the first electrode of the input capacitor Cpr, and a voltage of the first electrode of the storage capacitor Cst are changed into the same voltage while sharing the charged charges. The same voltage at this time is referred to as a first connection voltage. In the illustrated embodiment, the scan signal GW[1] may be applied to a first scan line, the scan signal GW[2] may be applied to a second scan line, the scan signal GW[n] may be applied to an n-scan line where n is a natural number greater than two.

Thereafter, the initialization voltage Vint is changed to the low voltage during the initialization period. As a result, the voltage value of the first electrode of the storage capacitor Cst (including the gate electrode of the driving transistor T1) is lowered. For this reason, the voltage of the anode (including the second electrode of the driving transistor T1) of the organic light emitting diode OLED and the first electrode of the input capacitor Cpr is also lowered. That is, when the initialization voltage Vint is changed to the low voltage during the initialization period, the first connection voltage is changed to a second connection voltage having a voltage value lower than a voltage value of the first connection voltage. At this time, the first connection voltage and the second connection voltage both have voltage values less than or equal to the voltage value of the second driving voltage ELVSS, so that the current does not flow in the organic light emitting diode OLED in the forward direction, and the organic light emitting diode OLED) does not emit light.

Thereafter, the first driving voltage ELVDD is changed from the first low voltage to the second low voltage having a voltage value less than that of the first low voltage, and the threshold voltage compensation period (Vth Comp.) proceeds. When the first driving voltage ELVDD is changed into the second low voltage, the voltage of the gate electrode connected to the first electrode of the driving transistor T1 by the parasitic capacitance, that is, the voltage of the first electrode of the storage capacitor Cst, may also be lowered. However, the second low voltage value of the first driving voltage ELVDD is sufficiently low so that the voltage of the gate electrode of the driving transistor T1 turns on the driving transistor T1. In the threshold voltage compensation period like the initialization period, the turn-on voltage is also applied to the scan signal GW and the control signal GC such that the second transistor T2 and the third transistor T3 are maintained in the turned-on state. Therefore, the driving transistor T1 is in a diode-connected state where the gate electrode of the driving transistor T1 and the second electrode of the driving transistor T1 are connected, and the current flows from the second electrode of the driving transistor T1 to the first electrode of the driving transistor T1 because the voltage of the gate electrode of the driving transistor T1 has the turn-on voltage value. Since the second electrode of the driving transistor T1 is connected to the gate electrode of the driving transistor T1, the voltage of the gate electrode of the driving transistor T1 is lowered as the charge flows out of the gate electrode of the driving transistor T1 toward the first electrode of the driving transistor T1. After the voltage of the gate electrode of the driving transistor T1 is lowered, the driving transistor T1 is turned off when the difference between the voltage of the gate electrode of the driving transistor T1 and the voltage of the first electrode of the driving transistor T1, that is, the second low voltage, becomes the threshold voltage value of the driving transistor T1. At this time, the voltage value of the gate electrode of the driving transistor T1 is greater than a voltage value of the second low voltage by the threshold voltage value of the driving transistor T1, and the voltage value is stored in the first electrode of the storage capacitor Cst. When the second low voltage value is referred to as "ELVDD_L2" and the threshold voltage value is referred to as "Vth", the value stored in the first electrode of the storage capacitor Cst is ELVDD_L2+Vth. As described above, since the value corresponding to the threshold voltage value of the driving transistor T1 is stored in the storage capacitor Cst, this period is referred to as the threshold voltage compensation period. Here, since both the second transistor T2 and the third transistor T3 are turned on, the voltage of the first electrode of the storage capacitor Cst and the voltage of the first electrode of the input capacitor Cpr have the same value, and the voltage of the anode electrode also has the same value.

In the threshold voltage compensation period, since the voltage values of the gate electrode and the second electrode of the driving transistor T1 are changed into the values that are lower than voltage values of the first connection voltage and the second connection voltage in the initialization period, both of the voltage values of the gate electrode and the second electrode of the driving transistor T1 may be smaller than the voltage value of the second driving voltage ELVSS. As a result, in the organic light emitting diode OLED, no current flows in the forward direction, and the organic light emitting diode OLED does not emit light.

Next, the scan signal GW applied to the scan line 142 and the control signal GC applied to the control signal line 143 are changed to the low voltage of the turn-off voltage, and the first driving voltage ELVDD is changed from the second low voltage to the high voltage. When the first driving voltage ELVDD is changed to the high voltage, the voltage of the gate electrode of the driving transistor T1 may be increased. That is, the value previously stored in the first electrode of the storage capacitor Cst is ELVDD_L2+Vth, and when the high voltage value of the first driving voltage ELVDD is ELVDD_H, the value stored in the first electrode of the storage capacitor Cst is ELVDD_H+Vth−a. Here, the voltage change value of the first electrode of the driving transistor T1 is smaller than the voltage change value of the gate electrode, and the value a represents a small degree thereof. As a result, the voltage difference between the first electrode and the gate electrode of the driving transistor T1 is lower than the voltage value of the threshold voltage Vth, so the driving transistor T1 does not generate the output. In addition, since the second transistor T2 and the third transistor T3 are in the turned-off state, the increasing in the voltage of the gate electrode of the driving transistor T1 does not affect the anode of the organic light emitting diode OLED. Therefore, the organic light emitting diode OLED still does not emit light.

Thereafter, a programming period (Programming) in which the turn-on voltage is sequentially applied to each scan line 142 is started. In the programming period (Programming), when the second transistor T2 is turned on by the scan signal GW of which the high voltage (the turn-on voltage) is sequentially applied to the scan line 142, the data voltage of the data voltage input terminal is transmitted to and stored in the first electrode of the storage capacitor Cst. The data voltage of the data voltage input terminal at this time as the voltage transmitted from the data line 171 through the input capacitor Cpr may have the voltage value lower than a voltage value of the data voltage Vdata applied from the data line 171. The voltage of the first electrode of the storage capacitor Cst before the programming period proceeds is (ELVDD_H+Vth−a), and when the data voltage of the data voltage input terminal is referred to as (Vdata−b) (here, b represents that the voltage value that is lower than the voltage value applied to the data line 171 is caused), the voltage of the first electrode of the storage capacitor Cst is (ELVDD_H+Vth−a+Vdata−b) after the programming period proceeds. At this time, the voltage difference between the first electrode and the gate electrode of the driving transistor T1 is set to be smaller than the voltage value of the threshold voltage Vth due to the values a and b. Therefore, the driving transistor T1 does not generate an output current. In the illustrated embodiment, the reference character DATA<1> may refer to a data voltage applied to a first pixel row and the reference character DATA<n> may refer to a data voltage applied to an n-th pixel row.

In FIG. 2, a holding period (Hold) is included within the programming period (Programming), and the holding period (Hold) as a period before or after the scan signal GW applies the turn-on voltage has the different holding period (Hold) for each scan line 142. The holding period (Hold) is a period in which the voltages of the storage capacitor Cst and other terminals are maintained.

When the data voltage of the data voltage input terminal is stored in the first electrode of the storage capacitor Cst of all pixels, while the initialization voltage Vint is changed from the low voltage to the high voltage, the organic light emitting diode OLED emit light. This is referred to as the light emission period.

When the initialization voltage Vint is changed into a high voltage, the voltage of the first electrode of the storage capacitor Cst is also increased, and the voltage difference between the first electrode and the gate electrode of the driving transistor T1 is greater than the voltage value of the threshold voltage Vth such that the drive transistor T1 emits the output current. The current output from the driving transistor T1 is transmitted to the anode of the organic light emitting diode OLED, and the degree to which the organic light emitting diode OLED emits light varies according to the magnitude of the current.

At this time, the voltage of the gate electrode of the driving transistor T1 is (ELVDD_H+Vth−a+Vdata−b+c), where c represents the voltage value that is increased while the initialization voltage Vint is changed into the high voltage. When the value c is set as a value that offsets the values a and b, the voltage of the gate electrode of the final driving transistor T1 becomes (ELVDD_H+Vth+Vdata). In this case, since the first electrode of the driving transistor T1 has the voltage value ELVDD_H, the voltage difference of the first electrode and the gate electrode is (Vth+Vdata), the value Vth is used when the driving transistor T1 is turned on, and only the remaining Vdata is used to determine the output current of the driving transistor T1 as it is. As a result, in the pixel in the illustrated embodiment, the output current of the driving transistor T1 is determined depending on the data voltage Vdata applied to the data line 171.

In addition, even though the threshold voltage Vth is different for each driving transistor T1, the corresponding value is already included in the gate electrode of the driving transistor T1 and compensated, and the output current is determined by the remaining data voltage Vdata, such that it is not necessary to consider the threshold voltage of each driving transistor T1. In addition, even when the threshold voltages of each of the driving transistors T1 are different, the same luminance is emitted for the same data voltage so that the display quality is not deteriorated.

Here, the value a, the value b, and the value c are determined according to the overlapping areas or intervals of pixels while designing the pixel, so that the pixel may be designed to offset these values. In addition, even when some values remain, all pixels are provided in a constant shape so that a constant value remains. As a result, when the voltage is applied to the data line in consideration of a constant value for all pixels, the final desired data voltage value may determine the output current of the driving transistor T1. Therefore, the threshold voltage may be compensated and the output voltage of the driving transistor T1 may be determined as an appropriate data voltage value.

In the light emission period (Emission), all pixels emit light at the same time for the same time duration. However, in an embodiment, the light emission may be performed by some pixels.

When the pixel of the organic light emitting diode display operating as described above is disposed on the actual substrate, a structure may be the same as in FIGS. 3 to 18 below.

FIGS. 3, 4, 7, 10, 13, and 17 are plan views divided according to manufacturing procedures of an organic light emitting diode display in the embodiment, and FIGS. 5, 6, 8, 9, 11, 12, 14, 15, 16, and 18 are cross-sectional views corresponding to a cross-sectional line among FIGS. 3, 4, 7, 10, 13, and 17.

Figure 3:
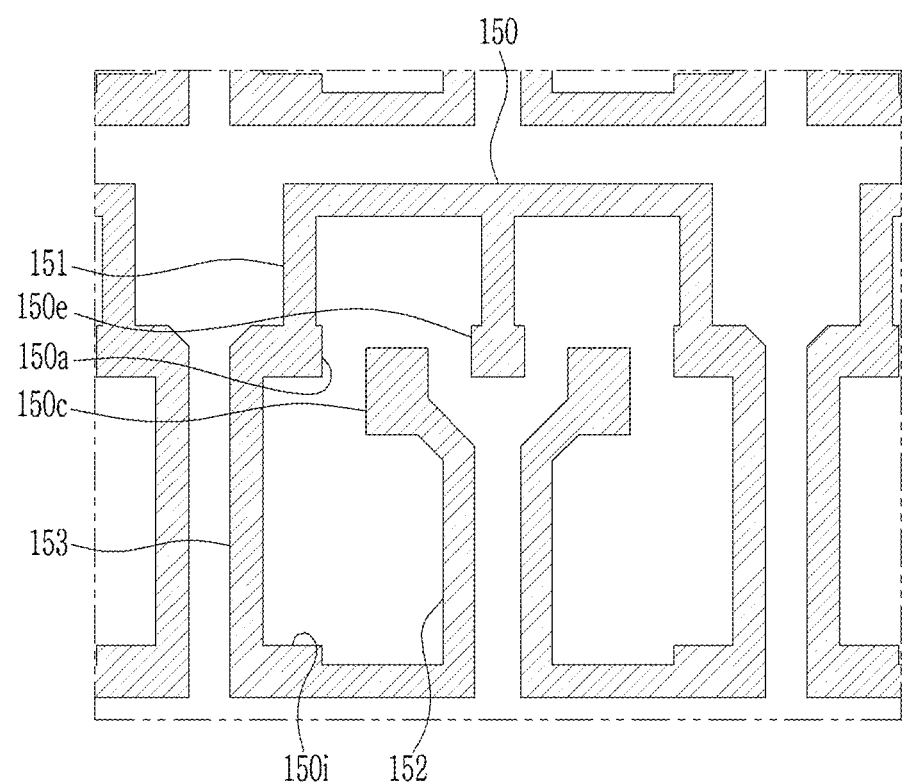
FIGS. 3, 4, 7, 10, 13, and 17 are plan views divided according to manufacturing procedures of an organic light emitting diode display in the embodiment.

First, FIG. 3 is described.

FIG. 3 is a plan view showing a semiconductor pattern 150 disposed on the substrate.

The semiconductor pattern 150 shown in FIG. 3 is a polycrystalline semiconductor, and is crystallized and provided through a crystallization process after forming a pattern of amorphous silicon.

In the semiconductor pattern 150, one unit semiconductor pattern having a symmetrical structure is repeatedly provided, and one unit semiconductor pattern 150 corresponds to two pixels. The use of the symmetrical structure is intended to form a high resolution display device such as a 4K resolution display device or an 8K resolution display device by sharing wiring and reducing the area to be occupied. When the wiring is reduced, openings defined to connect the wiring and other parts are also reduced, thereby reducing the area occupied.

The semiconductor pattern 150 extends upward from a first driving voltage input semiconductor 150e, then extends in the horizontal direction, i.e., extends in leftward and/or rightward directions, and then is bent downward and extends. A semiconductor 151 for the driving transistor T1 is positioned at the horizontal portion and the vertical portion with respect to the bent portion.

An anode electrode connecting semiconductor 150a is positioned at the portion extending downward from the semiconductor 151 for the driving transistor T1 and is bent outside, and a semiconductor 153 for the third transistor T3 is disposed at the portion extending outside therefrom and extending downward.

Subsequently, a data voltage input semiconductor 150i connected to the first electrode of the input capacitor Cpr is disposed at the portion which extends further downward and bends inward.

The semiconductor pattern 150 extends inward from the data voltage input semiconductor 150i and extends to be bent upwardly, and a semiconductor 152 for the second transistor T2 is disposed at the portion that extends to be bent upwardly.

The semiconductor pattern 150 extends upward from the semiconductor 152 of the second transistor T2, then extends in the oblique direction (the direction between the upper side and the outside) and then expands. The expanded portion is a storage capacitor connection semiconductor 150c which is connected to the first electrode of the storage capacitor Cst.

Next, the structure disposed on the semiconductor pattern 150 of FIG. 3 is described with reference to FIGS. 4 to 6.

Figure 4:
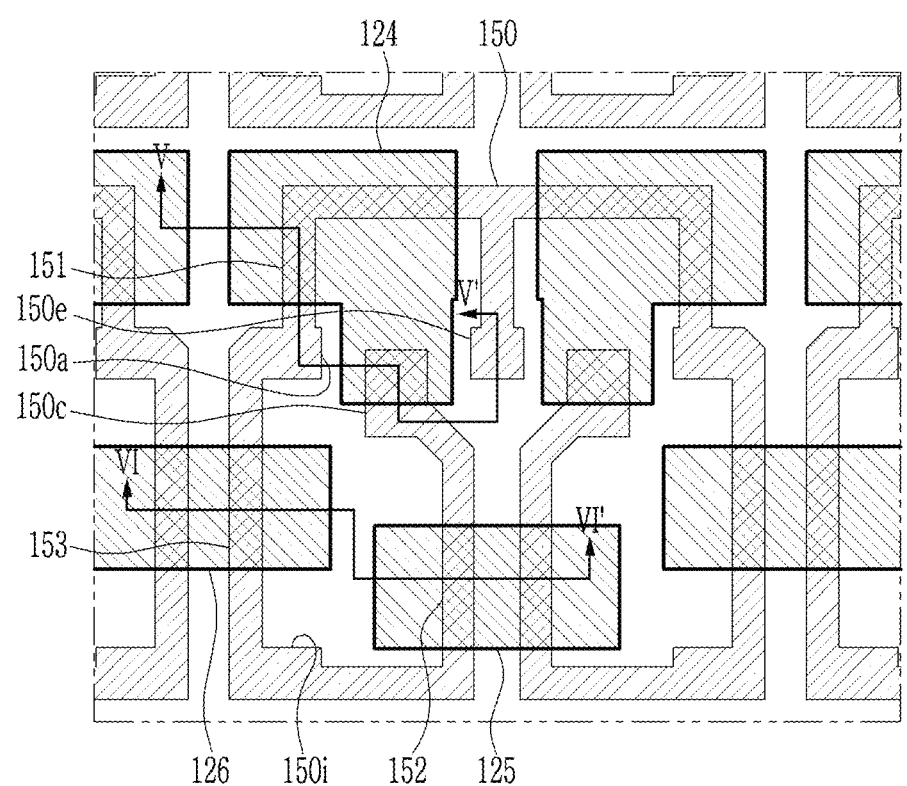
Figure 5:
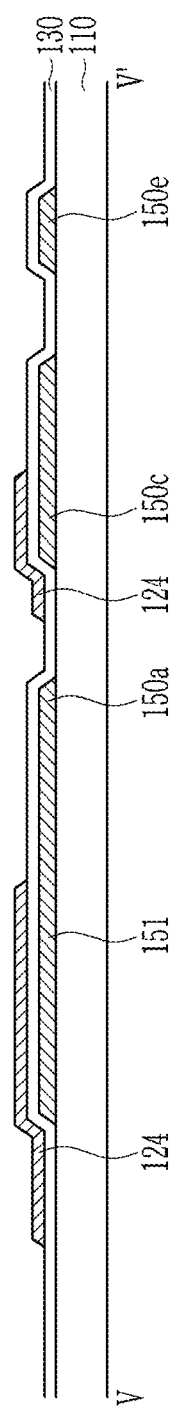
FIGS. 5, 6, 8, 9, 11, 12, 14, 15, 16, and 18 are cross-sectional views corresponding to a cross-sectional line among FIGS. 3, 4, 7, 10, 13, and 17.
Figure 6:
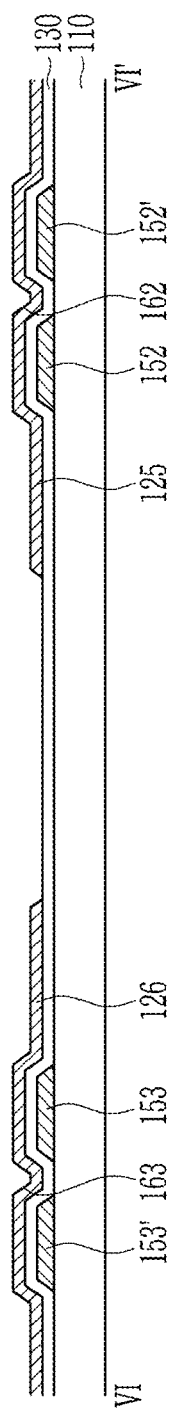

FIG. 4 is a plan view of the semiconductor pattern 150 and a first gate conductive layer disposed thereon, and FIGS. 5 and 6 are cross-sectional views taken along lines V-V' and VI-VI' of FIG. 4.

Referring to FIGS. 5 and 6, a first gate insulating layer 130 (hereinafter also referred to as a first insulating layer) is covered on the semiconductor pattern 150 disposed on a substrate 110. In FIGS. 5 and 6, semiconductors 152, 153, 152' and 153' are illustrated, and a prime symbol (') of 152' and 153' means that those semiconductors are not in the same pixel as the semiconductors 152 and 153 without the prime symbol ('), and are rather disposed in the adjacent pixel. This meaning of the prime symbol (') is used in the same way in the description herein. In an embodiment, the first gate insulating layer 130 includes an inorganic film, and may include a film including a silicon oxide (SiOx) or a film including a silicon nitride (SiNx), or may include a double layer including the above-described layers, for example.

A first gate conductive layer (hereinafter also referred to as a first conductive layer) is disposed on the first gate insulating layer 130. In another embodiment, the first gate conductive layer includes island-shaped gate electrodes 124, 125, and 126, is provided by etching a conductive layer by a mask after being deposited, and may include two or more conductive layers.

The first gate electrode 124 (hereinafter also referred to as a driving gate electrode) may be the gate electrode of the driving transistor T1, and also performs a role of the first electrode of the storage capacitor Cst. That is, the lower surface of the first gate electrode 124 faces the semiconductor 151 for the driving transistor T1 and plays the role of the gate electrode of the driving transistor T1, and the upper surface of the first gate electrode 124 faces a horizontal initialization voltage line 141 (referring to FIG. 7) to be described later and plays the role of the first electrode of the storage capacitor Cst. The first gate electrode 124 only corresponds to the driving transistor T1 of one pixel.

The second gate electrode 125 overlaps the semiconductor 152 of two facing second transistors T2 among one unit semiconductor pattern 150 to configure the gate electrode of the second transistor T2. As a result, the gate electrode of the second transistor T2 of two pixels includes one second gate electrode 125.

The third gate electrode 126 overlaps the semiconductor 153 for two facing third transistors T3 among two adjacent unit semiconductor patterns 150 to configure the gate electrode of the third transistor T3. As a result, the gate electrode of the third transistor T3 of the pixels is composed of one third gate electrode 126.

The first gate conductive layer in the illustrated embodiment does not have a linear structure extending in the horizontal direction, but has an island-shaped structure. Also, one gate electrode may have a maximum width corresponding to two adjacent pixels in a horizontal direction, and does not exceed the two adjacent pixels.

In order to apply the signal to each gate electrode 124, 125, and 126, a linear structure extending from the right to the left is desired, and the first gate conductive layer does not have such a structure as shown in FIG. 4.

After the first gate conductive layer is provided as shown in FIGS. 4 to 6, a doping process is performed. In the doping process, the semiconductor pattern 150 which is not covered by the first gate conductive layer is doped at a high concentration to have a conductor characteristic by the first gate conductive layer as a mask. A portion of the un-doped semiconductor pattern 150 constitutes a channel of the transistor. At this time, when the used doping material is an n-type material, the transistor becomes an n-type transistor, and when a p-type material is used, the transistor becomes a p-type transistor. In the case of the n-type transistor, a lightly doped region may be disposed between the conductive semiconductor portion and the channel of the transistor, which is described in further detail with reference to FIGS. 19 to 22.

Instead, the second gate conductive layer in an embodiment described below includes a linear pattern.

Hereinafter, the second gate conductive layer and the opening position are described with reference to FIGS. 7 to 9.

Figure 7:
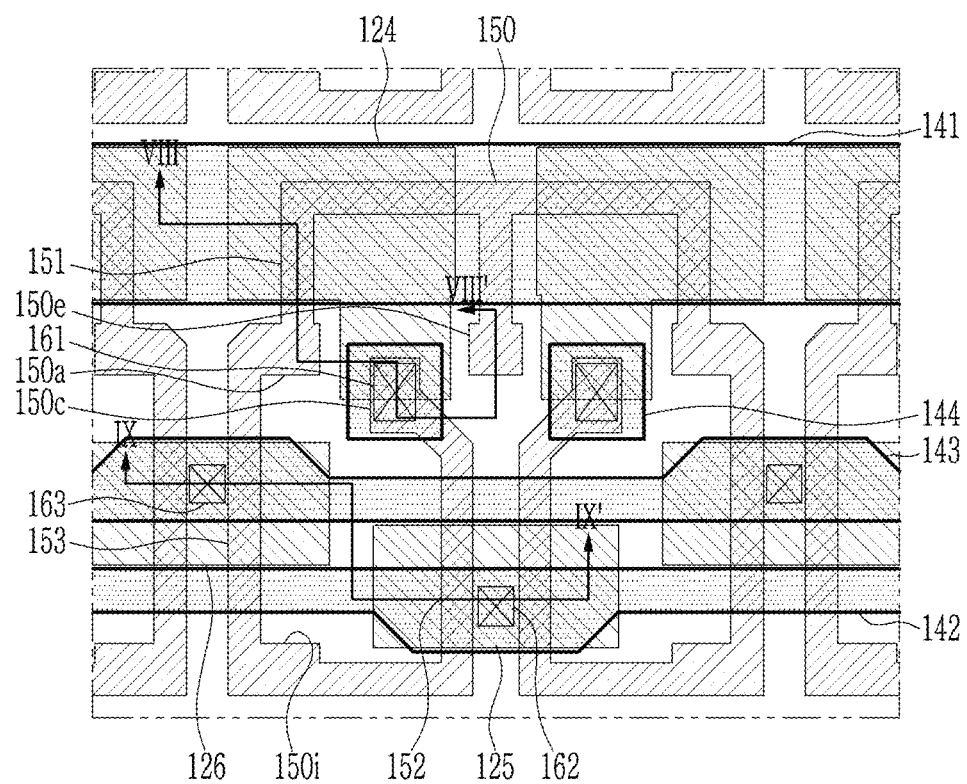
Figure 8:
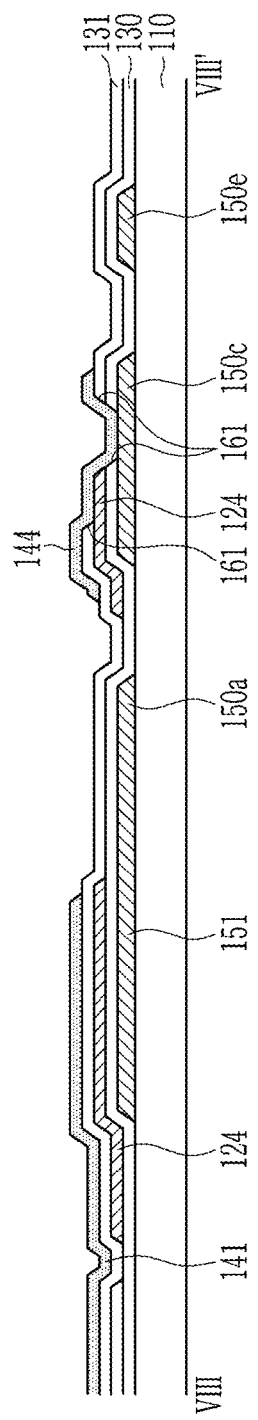
Figure 9:
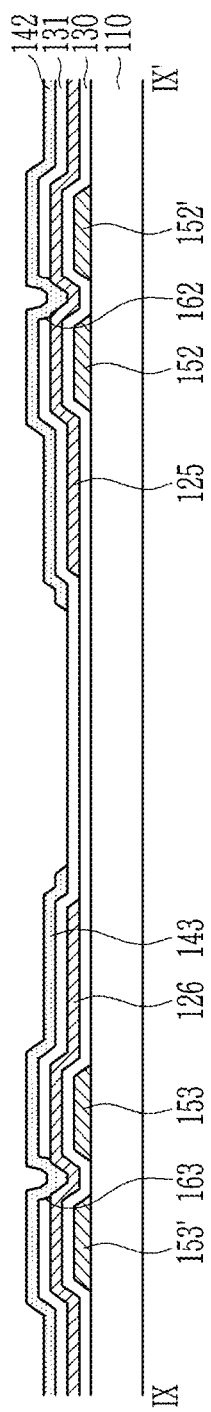

FIG. 7 is a plan view of the second gate conductive layer and the opening disposed on the semiconductor pattern 150 and the first gate conductive layer, and FIGS. 8 and 9 are cross-sectional views according to lines VIII-VIII' and IX-IX' of FIG. 7.

Referring to FIGS. 8 and 9, a second gate insulating layer 131 (hereinafter also referred to as a second insulating layer) is covered on the first gate conductive layer, and a second gate conductive layer (hereinafter also referred to as a second conductive layer) is disposed on the second gate insulating layer 131.

In an embodiment, the second gate insulating layer 131 may include an inorganic layer, and may include a film including a silicon oxide (SiOx) or a film including a silicon nitride (SiNx), or may include a double layer including the same.

The second gate conductive layer includes a horizontal initialization voltage line 141, a scan line 142, a control signal line 143, and a connecting member 144, and may be provided by etching the conductive layer by a mask after being deposited.

In addition, the second gate conductive layer may include two or more conductive layers in the embodiment.

Unlike the first gate conductive layer, the second gate conductive layer has a structure including wiring extending in the horizontal direction, and a wiring form in which all elements extend in the horizontal direction except the connection member 144.

The horizontal initialization voltage line 141 has wiring extending in the horizontal direction, and is disposed at the position overlapping the first gate electrode 124 to configure the storage capacitor Cst. That is, the first gate electrode 124 also plays the role of the first electrode of the storage capacitor Cst, and the lower surface of the horizontal initialization voltage line 141 plays the role of the second electrode of the storage capacitor Cst. Referring to FIG. 7, the horizontal initialization voltage line 141 has a vertical width that is substantially equal to the vertical width of the first gate electrode 124 to form a sufficiently large storage capacitor Cst.

The scan line 142 and the control signal line 143 also have a wiring shape extending in the horizontal direction.

The scan line 142 extends while overlapping the second gate electrode 125, and is electrically connected to the second gate electrode 125 through an opening 162.

Also, the control signal line 143 extends while overlapping the third gate electrode 126, and is electrically connected to the third gate electrode 126 through an opening 163.

The connection member 144 has the only island-like structure among the second gate conductive layers, and one connection member 144 is provided for each pixel. The connection member 144 electrically connects the storage capacitor connection semiconductor 150c and the first gate electrode 124 through an opening 161. In particular, since the connection member 144 and the opening 161 may have a side contact structure, a portion of the upper surface of the first gate electrode 124 and a portion of the upper surface of the storage capacitor connecting semiconductor 150c are exposed by the opening 161, and the connecting member 144 electrically connects the two.

Such a side contact structure has an advantage that the occupied horizontal area is narrow, which is suitable for high-resolution pixels, and the area overlapping the data line 171 to be provided in a subsequent process is reduced, thereby having a merit that the structure is less affected by the voltage variation of the data line 171.

A summarized feature regarding the structures of the first gate conductive layer and the second gate conductive layer is that the first gate conductive layer is provided only with an island structure and a linear structure is provided in the second gate conductive layer. This feature has an advantage that the space arrangement may be efficient, thereby having an advantage of forming a large area of the input capacitor Cpr. This is because the horizontal initialization voltage line 141, the scan line 142, and the control signal line 143 are disposed in the second gate conductive layer and are evenly disposed in the pixel area so that the first data conductive layer and the second data conductive layer to be disposed thereon may have a relatively flat structure, thereby allowing the input capacitor Cpr to have sufficiently large capacitance.

Hereinafter, the first data conductive layer is described with reference to FIGS. 10 to 12.

Figure 10:
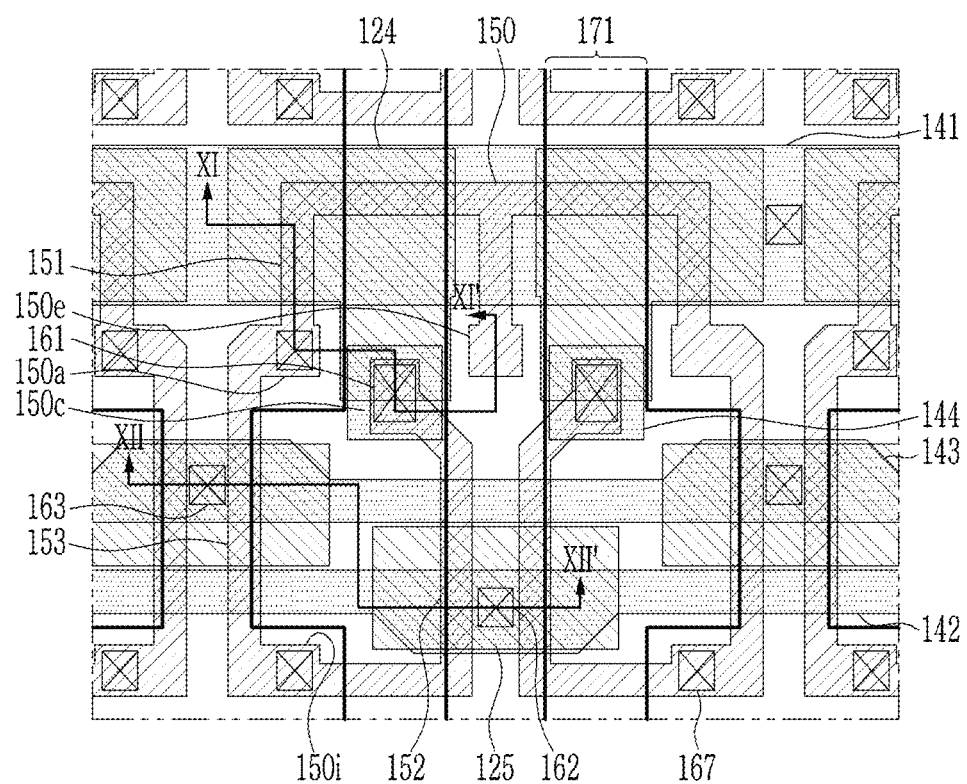
Figure 11:
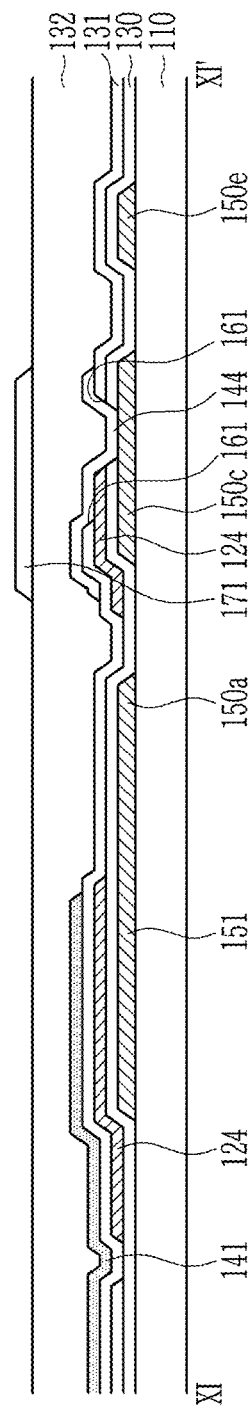
Figure 12:
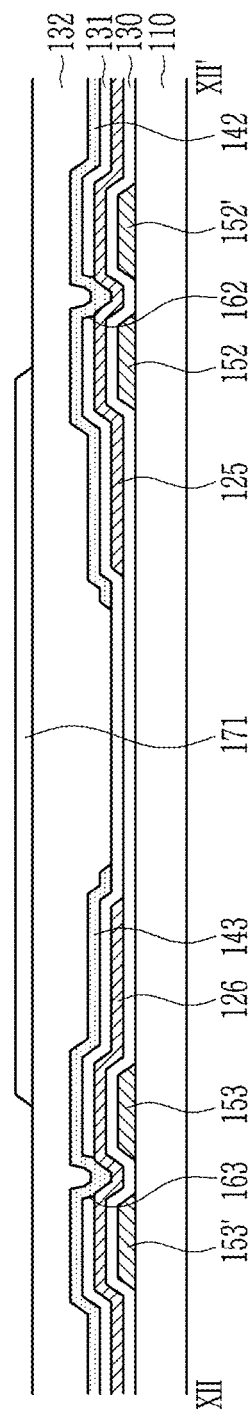

FIG. 10 is a plan view of the first data conductive layer disposed on the semiconductor pattern 150, the first gate conductive layer, and the second gate conductive layer, and FIGS. 11 and 12 are cross-sectional view taken along lines XI-XI' and XII-XII' of FIG. 10.

Referring to FIGS. 11 and 12, a first interlayer insulating layer 132 (hereinafter also referred to as a third insulating layer) is disposed on the second gate conductive layer, and a first data conductive layer (hereinafter also referred to as a third conductive layer) is disposed on the first interlayer insulating layer 132.

The first interlayer insulating layer 132 includes an inorganic film and is provided to have a thick thickness to reduce the step occurring when the conductive layer and the inorganic film are repeatedly provided. In an embodiment, the first interlayer insulating layer 132 may include a film including a silicon oxide (SiOx) or a film including a silicon nitride (SiNx), and may include a double layer including each of them in order to increase the thickness.

The first data conductive layer includes a data line 171 and is provided by depositing a conductive layer and then etching the conductive layer by a mask, and in an embodiment, the first data conductive layer may include a conductive layer of two or more layers. Unlike the second gate conductive layer, the first data conductive layer includes the data line 171 extending in the vertical direction.

Two data lines 171 are provided with respect to one semiconductor pattern 150, and one data line 171 is provided with respect to one pixel column. Two data lines 171 corresponding to one semiconductor pattern 150 have a symmetrical structure with respect to the center line in the vertical direction of the semiconductor pattern 150. In addition, the data line 171 includes an expansion portion that is wider than an extension portion of the data line 171, and the expansion portion of the data line 171 serves as the second electrode of the input capacitor Cpr. Due to the expansion portion of the data line 171, the input capacitor Cpr may have the largest capacitance.

Hereinafter, the second data conductive layer and the opening position are described with reference to FIGS. 13 to 16.

Figure 13:
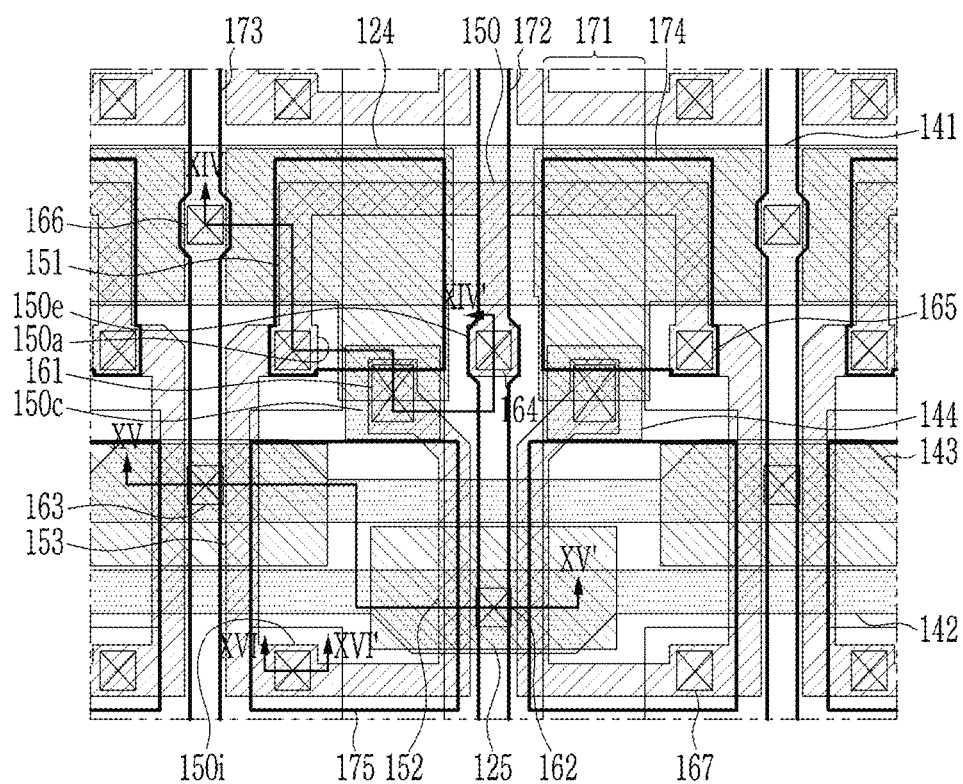
Figure 14:
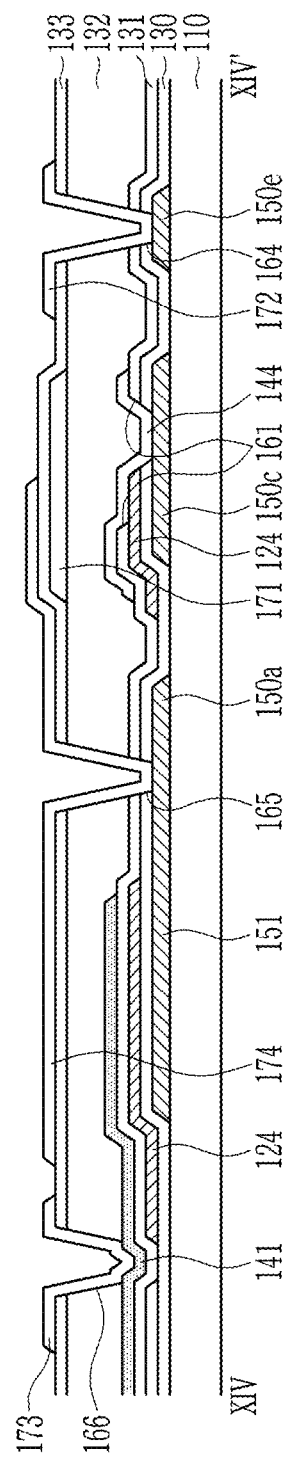
Figure 15:
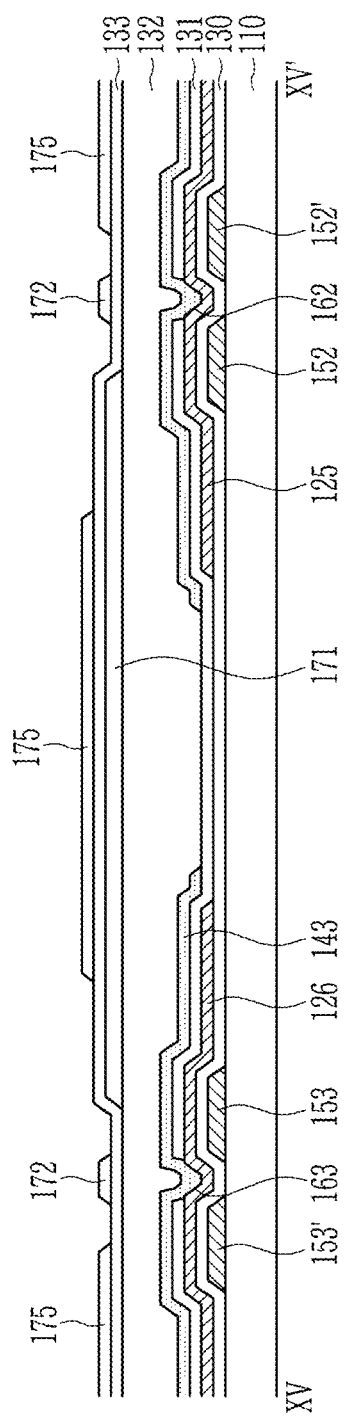
Figure 16:
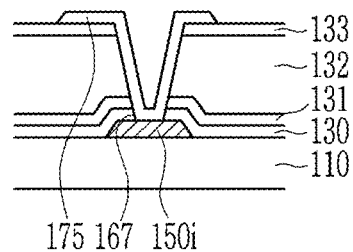

FIG. 13 is a plan view of the second data conductive layer disposed on the semiconductor pattern 150, the first gate conductive layer, the second gate conductive layer, and the first data conductive layer, and FIGS. 14 to 16 are cross-sectional views taken along lines XIV-XIV', XV-XV', and XVI-XVI' of FIG. 13.

Referring to FIGS. 14 to 16, a second interlayer insulating layer 133 (hereinafter also referred to as a fourth insulating layer) is covered on the first data conductive layer, and a second data conductive layer (hereinafter also referred to as a fourth conductive layer) is disposed on the second interlayer insulating layer 133.

The second interlayer insulating layer 133 includes an inorganic film, and may include a film including a silicon oxide (SiOx) or a film including a silicon nitride (SiNx), or may include a double layer including both.

The second data conductive layer includes a first driving voltage line 172, a vertical initialization voltage line 173, an anode electrode connecting member 174, and a first electrode 175 which is for the input capacitor.

The second data conductive layer is provided by depositing a conductive layer and then etching it by a mask, in an embodiment, or the second data conductive layer may include a conductive layer of two or more layers.

The first driving voltage line 172 extends in the vertical direction and is a wire that transfers the first driving voltage ELVDD. In addition, referring to FIG. 14, the first driving voltage line 172 is electrically connected to the first driving voltage input semiconductor 150e through an opening 164. As a result, the first driving voltage ELVDD is transmitted to the first driving voltage input semiconductor 150e of the semiconductor pattern 150. Since the first driving voltage lines 172 are provided one by one for one semiconductor pattern 150, two pixel columns have a structure sharing a single driving voltage line 172. As a result, the area occupied by the pixel is reduced.

The vertical initialization voltage line 173 also extends in the vertical direction and is a wiring for transmitting the initialization voltage Vint. Referring to FIG. 14, the vertical initialization voltage line 173 is electrically connected to the horizontal initialization voltage line 141 through an opening 166. As a result, the initialization voltage Vint is connected horizontally and vertically so that a voltage is applied in the form of a mesh, and a constant initialization voltage Vint may be applied to the pixels disposed at the various positions.

The first driving voltage line 172 and the vertical initialization voltage line 173 extend in a direction parallel to the data line 171 disposed in the first data conductive layer.

However, the first driving voltage line 172 and the vertical initialization voltage line 173 are disposed in the second data conductive layer to be disposed on the different layer from the data line 171, so that the data line 171 has a sufficiently wide width without considering other wirings. As a result, the input capacitor Cpr may have a sufficiently large capacitance, so that the data voltage may enter into the pixel with high efficiency.

The anode electrode connecting member 174 has an island structure and is provided one per pixel. Referring to FIG. 14, the anode electrode connecting member 174 is connected to the anode electrode connecting semiconductor 150a through an opening 165. The output current of the driving transistor T1 is transmitted to an anode electrode 191 (referring to FIGS. 17 and 18) through the anode electrode connecting semiconductor 150a and the anode electrode connecting member 174. That is, the anode electrode connecting member 174 is connected to the anode electrode connecting semiconductor 150a below and to the anode electrode 191 above.

The first electrode 175 for the input capacitor also has an island structure, and is provided one per pixel. As shown in FIG. 13, the first electrode 175 has an area as large as possible, and referring to FIG. 15, the first electrode 175 provides the input capacitor Cpr by overlapping the expansion portion of the data line 171. Also, referring to FIG. 16, the first electrode 175 for the input capacitor is connected to the data voltage input semiconductor 150i through an opening 167. As a result, the data voltage transmitted through the input capacitor Cpr is transmitted to the data voltage input semiconductor 150i between the second transistor T2 and the third transistor T3. The data voltage is applied along the data line 171 and then capacitively coupled and transmitted to the first electrode 175 for the input capacitor, and the transmitted data voltage is transmitted to the data voltage input semiconductor 150i through the opening 167.

In order for the data voltage to be capacitively coupled and transmitted to the first electrode 175 for the input capacitor, the larger overlapping area of the expansion line of the data line 171 and the first electrode 175 for the input capacitor is advantageous, so that only the data line 171 is disposed in the first data conductive layer for securing the maximum area.

The pixels of the organic light emitting diode display may be largely divided into an organic light emitting element portion and a pixel circuit portion, and the pixel circuit is the part shown in FIGS. 3 to 16 and the layer above anode electrode 191 corresponds to the organic light emitting element portion. Hereinafter, the arrangement and structure of the organic light emitting element portion is described with reference to FIGS. 17 and 18.

Figure 17:
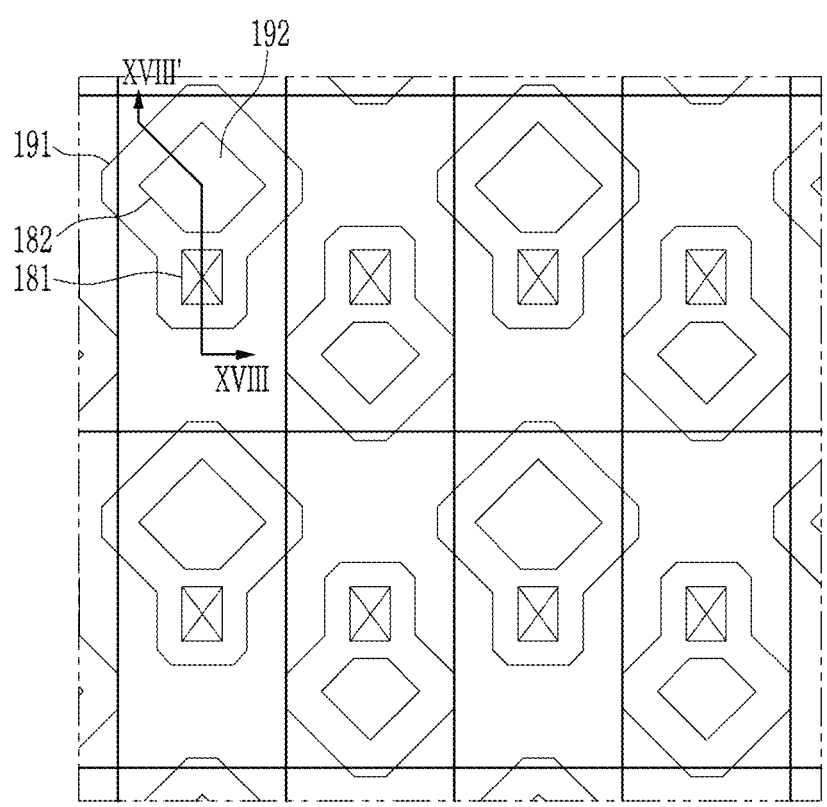
Figure 18:
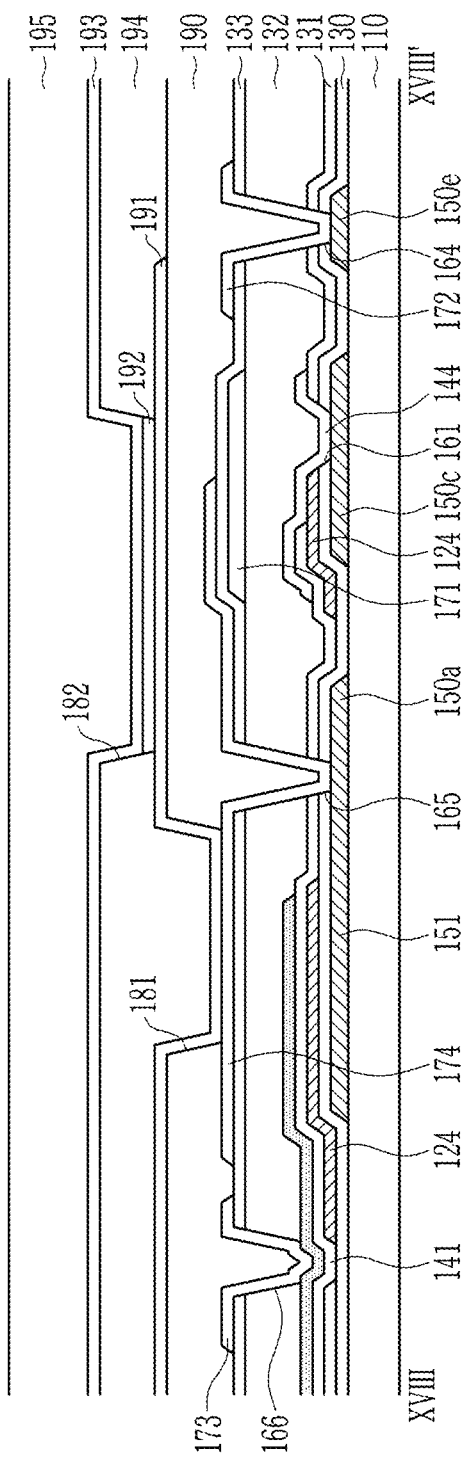

FIG. 17 is a plan view showing a portion of the anode electrode 191 and an organic emission layer 192, and FIG. 18 is a cross-sectional view taken along line XVIII-XVIII' of FIG. 17.

In FIG. 17, wires disposed below the anode electrode 191 are not illustrated in order to prevent the drawing from being complicated, and one pixel circuit unit is simply shown with a rectangular shape to be distinguished. The wiring structure of FIGS. 3 to 16 is provided within one rectangle shape.

Referring to FIG. 18, the anode electrode 191 is connected to the anode electrode connecting member 174 through an opening 181 disposed in the organic layer 190 to receive the output current of the driving transistor T1. A partition wall 194 is disposed on the anode electrode 191, and an opening 182 is defined in the partition wall 194 to expose a portion of the anode electrode 191.

The organic emission layer 192 is disposed on the exposed anode electrode 191 and within the opening 182 of the partition wall 194. The cathode electrode 193 is entirely disposed on the upper surface of the partition 194 and the organic emission layer 192.

An encapsulation layer 195 is disposed thereon to prevent moisture and oxygen from entering the organic light emitting layer 192 from the outside. In FIG. 18, the encapsulation layer 195 is illustrated as a single layer, but it includes at least one organic layer and at least one inorganic layer, which are alternately provided to block moisture and oxygen from the outside. In an embodiment, the encapsulation layer 195 may have a triple layer structure including a first inorganic film, an organic film, and a second inorganic film.

A touch electrode may be disposed on the encapsulation layer 195, or a polarizer or a window may be disposed.

Referring to FIG. 17, it may be confirmed that the positions of the openings 181 defined in the organic layer 190 are the same positions in all pixels. However, the position of the opening 182 defined in the partition wall 194 is repeatedly positioned up and down with respect to the opening 181 of the organic layer 190. This is a structure capable of forming a large size of the opening 182 defined in the partition wall 194. That is, the opening 182 of the partition wall 194 may be defined in the upper portion of the adjacent pixel circuit portion, so that the area occupied by the organic light emitting layer 192 may be widened. As a result, the area where light is emitted may also be widened.

Each organic light emitting layer 192 displays one color of primary colors such as red, green, and blue. In an embodiment, a number ratio of the organic light emitting element of red to the organic light emitting element of green to the organic light emitting element of blue may be 1:1:1, and the organic light emitting device of one color may be provided in a greater number than the organic light emitting devices of other colors. That is, in the embodiment, a number ratio of the organic light emitting element of red to the organic light emitting element of green to the organic light emitting element of blue may be 1:2:1, and the organic light emitting elements may be arranged in order of red, green, blue, and green.

As shown in FIGS. 3 to 18, to use the semiconductor pattern 150 or the like having the left and right symmetrical structure is to form a high resolution display device such as a 4K resolution display device or an 8K resolution display device by reducing the occupied area since two adjacent pixels have one wiring line by sharing the first driving voltage lines 172 and the vertical initialization voltage line 173. In this way, when the wiring is reduced, the openings provided to connect the wiring and other parts are also reduced, thereby further reducing the area that is occupied.

The portion where the occupied area is reduced may be used to increase the area where the expansion portion of the data line 171 overlaps the first electrode 175 for the input capacitor. As the overlapping area is increased, the capacitance of the input capacitor Cpr is increased such that the efficiency in which the data voltage is capacitively coupled and transferred from the data line 171 to the first electrode 175 for the input capacitor is increased.

Hereinafter, a method of forming the lightly doped region when forming the n-type transistor is described through FIGS. 19 to 22 in detail.

Figure 19:
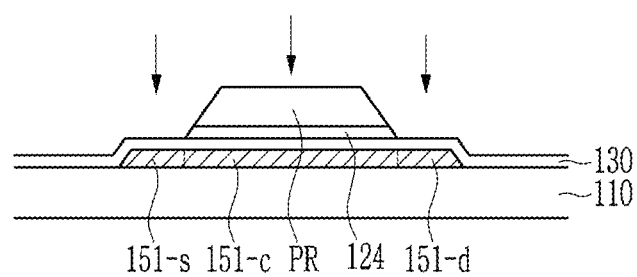
FIGS. 19 and 20 are cross-sectional views showing an embodiment of a method of forming a lightly doped region in an organic light emitting diode display.
Figure 20:
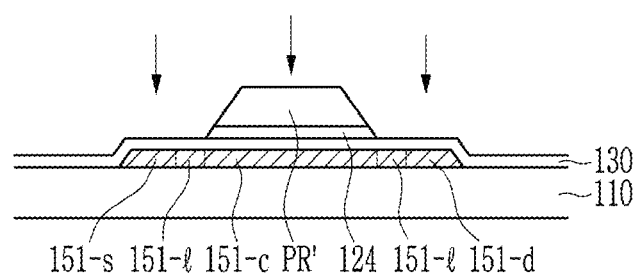

First, a method of forming the lightly doped region is described generally with reference to FIGS. 19 and 20.

FIGS. 19 and 20 are cross-sectional views showing an embodiment of a method of forming the lightly doped region in the organic light emitting diode display.

The semiconductor layer and the first gate insulating layer 130 are disposed on the substrate 110. Next, a material for forming the first gate conductive layer is deposited, a photoresist is disposed and then exposed to form a photoresist pattern PR, and then the material for forming the first gate conductive layer is etched along the photoresist pattern PR to form the first gate electrode 124. In this state, doping is performed with a high concentration as shown in FIG. 19. The semiconductor layer that is covered by the photoresist pattern PR and the first gate electrode 124 is not doped to become a channel region 151-c, and the semiconductor layer doped with the high concentration is conductive to become a source region 151-s and a drain region 151-d.

Thereafter, as shown in FIG. 20, the size of the photoresist pattern PR is reduced through ashing, and the first gate electrode 124 is further etched along the reduced photoresist pattern PR'. As a result, the area where the semiconductor layer and the first gate electrode 124 overlap is reduced. Subsequently, when light doping is executed, the semiconductor layer that does not overlap with the first gate electrode 124 among the portion that is previously the channel region 151-c becomes a lightly doped region 151-1.

Here, the material doped with the high concentration and the material doped with the low concentration are both applied to the n-type transistor by an n-type dopant.

When the lightly doped region is provided in the above manner, an additional mask may not be desired, thereby reducing the manufacturing cost and processing time.

Such a process may be applied to the embodiment of FIGS. 3 to 18. The periphery of the opening 161 that is side-contacted is shown through FIGS. 21 and 22.

Figure 21:
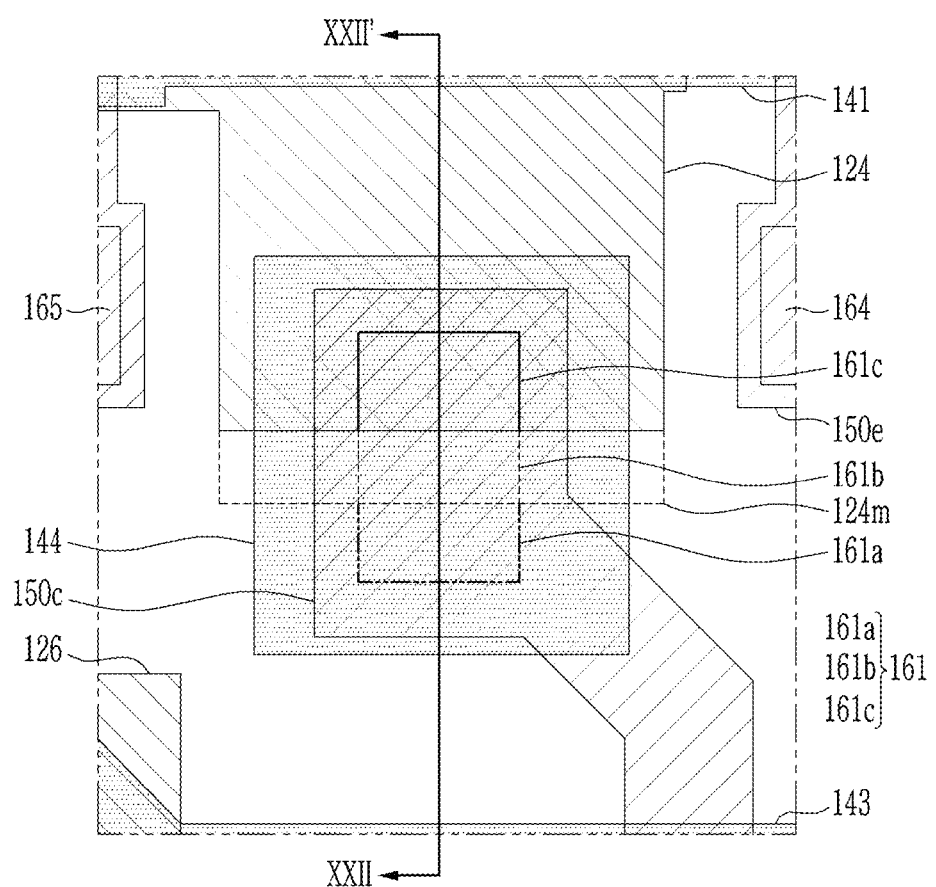
FIG. 21 is an enlarged plan view of an embodiment of a contact part among one pixel of an organic light emitting diode display according to FIGS. 19 and 20.
Figure 22:
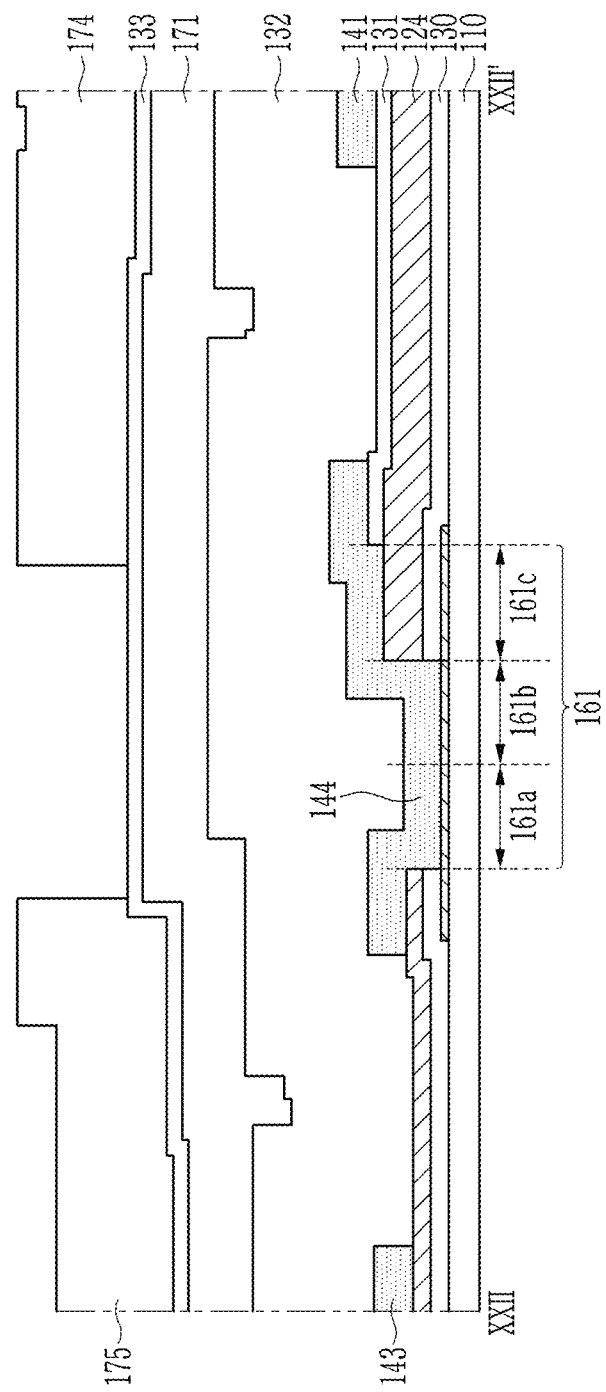
FIG. 22 is a cross-sectional view taken along line XXII-XXII' of FIG. 21.

FIG. 21 is an enlarged plan view of an embodiment of a contact portion among one pixel of an organic light emitting diode display provided according to FIGS. 19 and 20, and FIG. 22 is a cross-sectional view taken along line XXII-XXII' of FIG. 21.

In FIGS. 21 and 22, the opening 161 is largely divided into three parts. A first opening 161a is an opening corresponding to the heavily doped region, a second opening 161b is an opening corresponding to the lightly doped region, and a third opening 161c is an opening corresponding to the non-doped region.

In addition, the first gate electrode 124 is reduced in size while being additionally etched, which is indicated by a dotted line. A dot-lined part 124m serves as a mask during the high concentration doping and is then removed. Thereafter, the light doping is performed by the first gate electrode 124 in a final form as a mask.

The connection member 144 of the second gate conductive layer that is side-contacted has a structure that contacts not only the heavily doped semiconductor but also the lightly doped semiconductor. Since the conductive properties are improved by the doping, there is a merit that the side contact properties are also improved.

Even when the p-type transistor is provided, a lightly doped region may be provided, but it is not generally provided because there is no problem in operation.

Hereinafter, the part in which the input capacitor Cpr is provided is described more clearly with reference to FIGS. 23 and 24.

Figure 23:
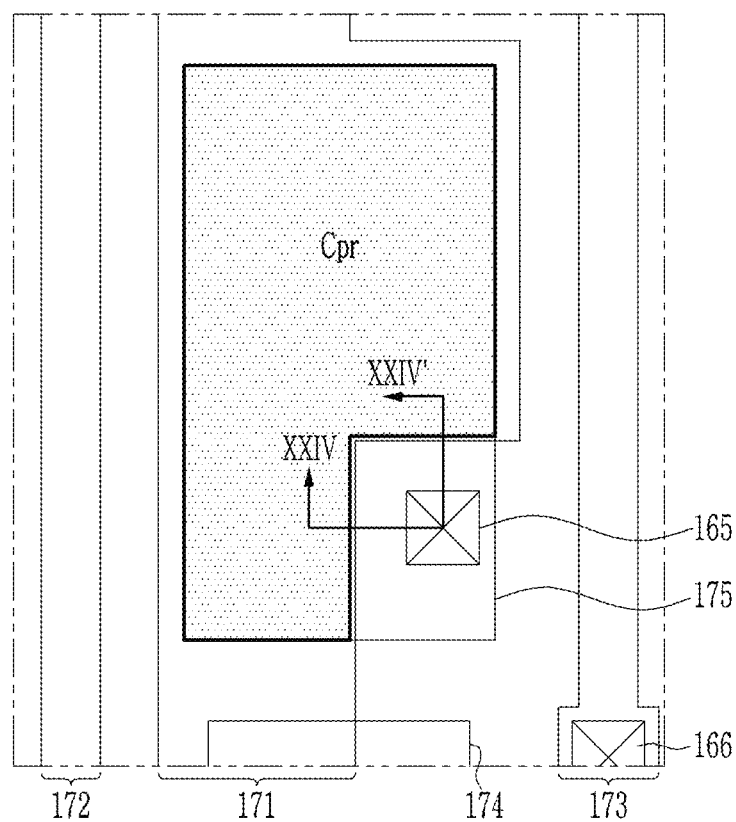
FIG. 23 is a plan view of an embodiment of a partial conductive layer of a part where an input capacitor is provided among one pixel of an organic light emitting diode display.
Figure 24:
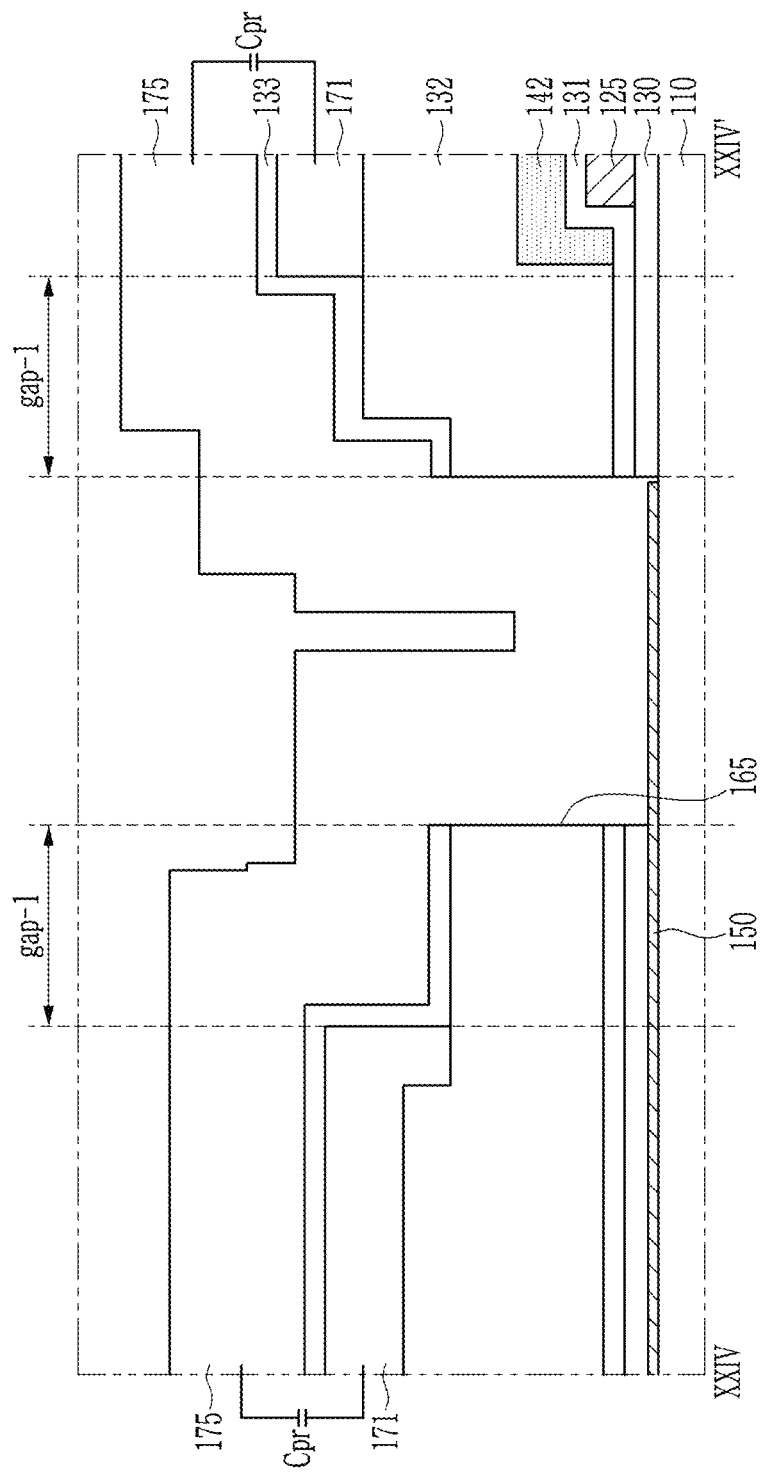
FIG. 24 is a cross-sectional view taken along line XXIV-XXIV' of FIG. 23.

FIG. 23 is a plan view of an embodiment of a partial conductive layer of a part where an input capacitor is provided among one pixel of an organic light emitting diode display, and FIG. 24 is a cross-sectional view taken along line XXIV-XXIV' of FIG. 23.

In FIG. 23, the data line 171 and the first electrode 175 for the input capacitor are mainly shown as a center, and a portion where the two are overlapped is indicated by a thick line to show a space occupied by the input capacitor Cpr.

Both the first electrode 175 for the input capacitor and the expansion part of the data line 171 are designed to be provided into the maximum width, so that the efficiency of transferring the data voltage through the coupling is high. For this purpose, only the data line 171 is provided as a separate first data conductive layer to be sufficiently large.

Referring to FIG. 24, since the first electrode 175 for the input capacitor is desired to be connected to the semiconductor pattern 150 connected through the opening 165, it is necessary to form a predetermined interval gap-1 between the expansion part of the data line 171 and the opening 165. In the case where the gap gap-1 is narrowly provided, the first electrode 175 for the input capacitor and the data line 171 may be shorted so that it is necessary to form a predetermined gap to be secured.

Figure 25:
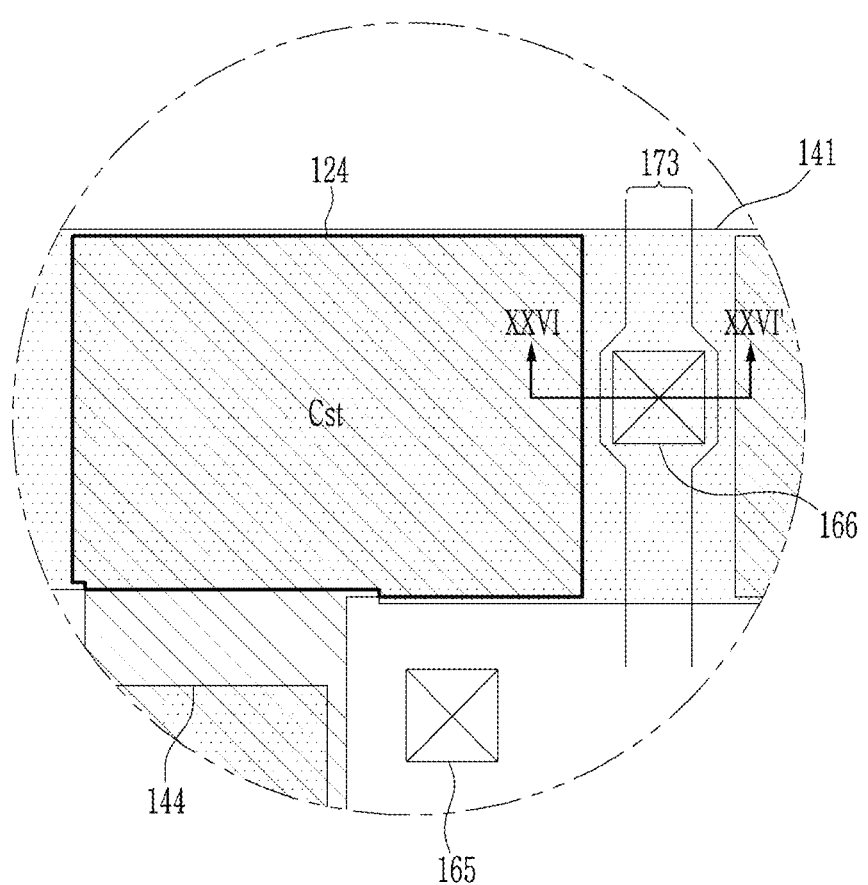
FIG. 25 is a plan view of an embodiment of a partial conductive layer of a part where a storage capacitor is provided among one pixel of an organic light emitting diode display.
Figure 26:
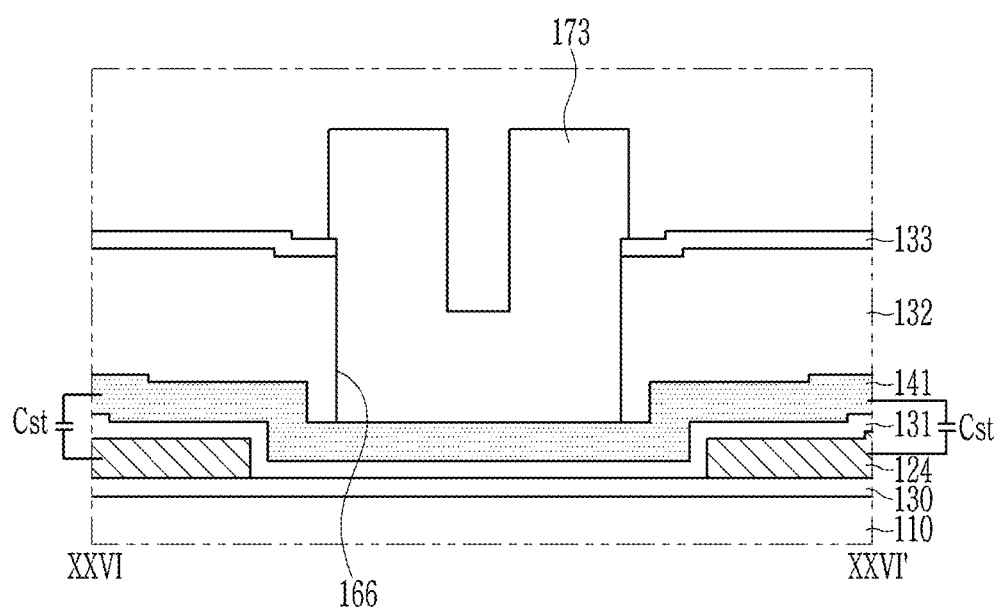
FIG. 26 is a cross-sectional view taken along line XXVI-XXVI' of FIG. 25.

The portion in which the storage capacitor Cst is provided is described more clearly with reference to FIGS. 25 and 26.

FIG. 25 is a plan view of an embodiment of a partial conductive layer of a part where a storage capacitor is provided among one pixel of an organic light emitting diode display, and FIG. 26 is a cross-sectional view taken along line XXVI-XXVI' of FIG. 25.

The storage capacitor Cst is disposed at the position where the horizontal initialization voltage line 141 and the first gate electrode 124 are overlapped. In FIG. 25, a portion where two portions overlap each other is shown to be thick. The horizontal initialization voltage line 141 is connected to the vertical initialization voltage line 173 through the opening 166. As a result, the initialization voltage Vint may have a constant voltage value in every pixel.

Hereinafter, a deformable embodiment is described with reference to FIGS. 27 and 28.

First, the structure that is electrically connected by a contact auxiliary member is described with reference to FIG. 27.

Figure 27:
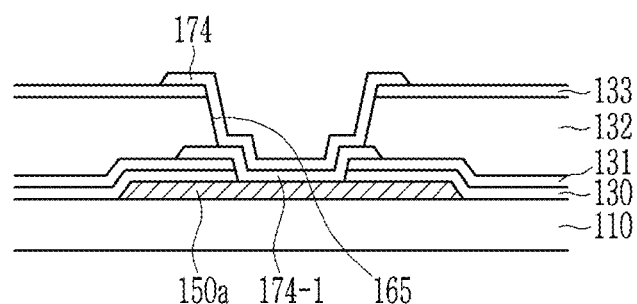
FIG. 27 is an enlarged plan view of an embodiment of a contact part among one pixel of an organic light emitting diode display.

FIG. 27 is an enlarged cross-sectional view of a contact portion among one pixel of an organic light emitting diode display according to another embodiment.

FIG. 27 shows a structure in which the anode electrode connecting member 174 and the anode electrode connecting semiconductor 150a are connected by disposing a contact auxiliary member 174-1 therebetween in the structure in which the anode electrode connecting member 174 is connected to the anode electrode connecting semiconductor 150a through the opening 165.

The anode electrode connecting member 174 is disposed in the second data conductive layer and the anode electrode connecting semiconductor 150a is disposed directly on the substrate 110, thereby a vertical distance is large. Since it may be difficult for the anode electrode connecting member 174 to contact the anode electrode connecting semiconductor 150a, the anode electrode connecting member 174 and the anode electrode connecting semiconductor 150a may be connected by one conductive layer among the first gate conductive layer, the second gate conductive layer, and the first data conductive layer. FIG. 27 illustrates a structure connected through the contact auxiliary member 174-1 disposed in the first data conductive layer. However, in an embodiment, a contact auxiliary member disposed on the first gate conductive layer or the second gate conductive layer may be used.

Also, in addition to the case in which the anode electrode connecting member 174 is connected to the anode electrode connecting semiconductor 150a through the opening 165, the contact auxiliary member may be used in a portion connected through another opening.

An embodiment in which the positions of the scan line 142 and the control signal line 143 are changed is described with reference to FIG. 28.

Figure 28:
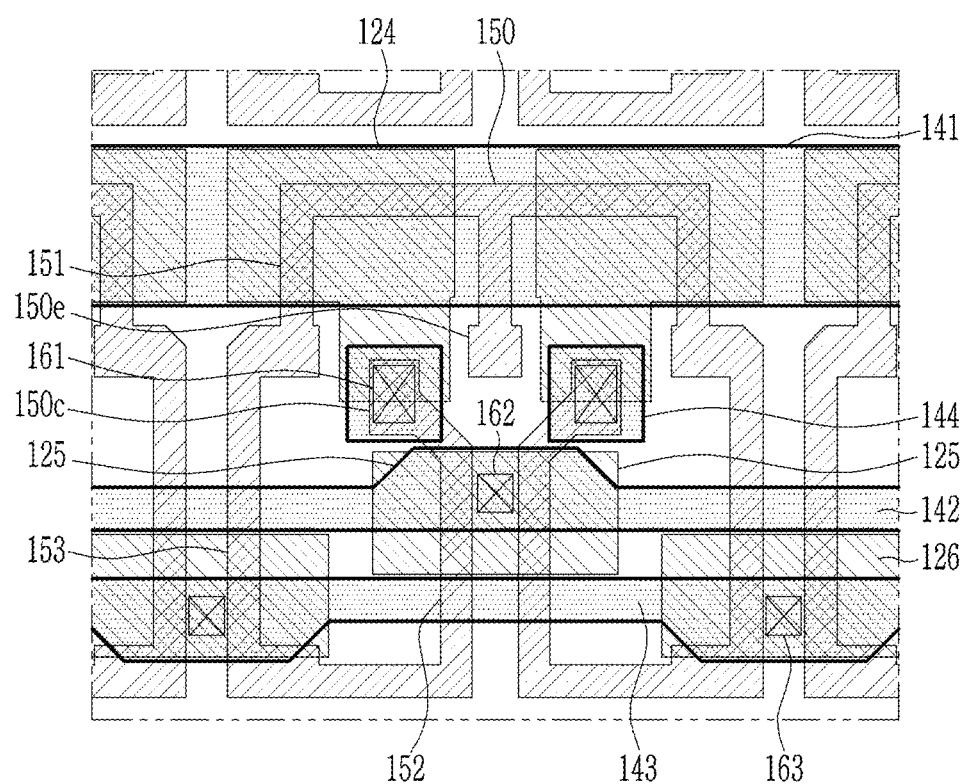
FIG. 28 is a plan view of an embodiment of one pixel of an organic light emitting diode display.

FIG. 28 is a plan view of an embodiment of one pixel of an organic light emitting diode display.

FIG. 28 is a drawing corresponding to FIG. 7. However, in FIG. 28, there is a difference that the scan line 142 is positioned below and the control signal line 143 is positioned above. In addition, in FIG. 28, the second gate electrode 125 is also disposed below compared with the third gate electrode 126.

Even when the upper and lower positions are changed as described above, it is the same that the scan line 142 is electrically connected to the second gate electrode 125 through the opening 162, and the control signal line 143 is electrically connected to the third gate electrode 126 through the opening 163.

Moreover, the circuit diagrams are the same from a circuit viewpoint.

FIG. 28 shows that the characteristic may be changed while the node voltages of other pixels are changed due to the signals applied to the scan line 142 and the control signal line 143 as the wires are densely provided so that one of the embodiment of FIG. 7 or the embodiment of FIG. 8 may be used according to a suitable situation. However, the invention is not limited thereto, and both embodiments may be used when there is no significant difference.

The foregoing focuses on the case where all transistors use the n-type transistors. However, depending on an embodiment, a p-type transistor may be used. There is a difference that the n-type transistor operates only when a voltage value of the voltage of the gate electrode is higher than or equal to the voltage value of the threshold voltage of the voltage of the first electrode while the p-type transistor operates only when a voltage value of the voltage of the gate electrode is lower than a voltage value of the voltage of the first electrode by the threshold voltage value or more. In addition, although the lightly doped region is provided in the n-type transistor, the lightly doped region may not be provided in the p-type transistor. Due to this difference, the waveform to be applied is changed when using the p-type transistor, which is described in detail below.

Hereinafter, the pixel for the organic light emitting diode display using the p-type transistor is described with reference to FIGS. 29 and 30.

Figure 29:
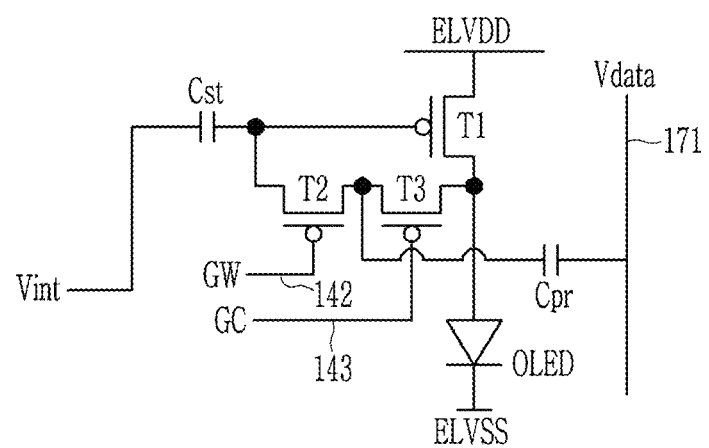
FIG. 29 is an equivalent circuit diagram of another embodiment of one pixel of an organic light emitting diode display.
Figure 30:
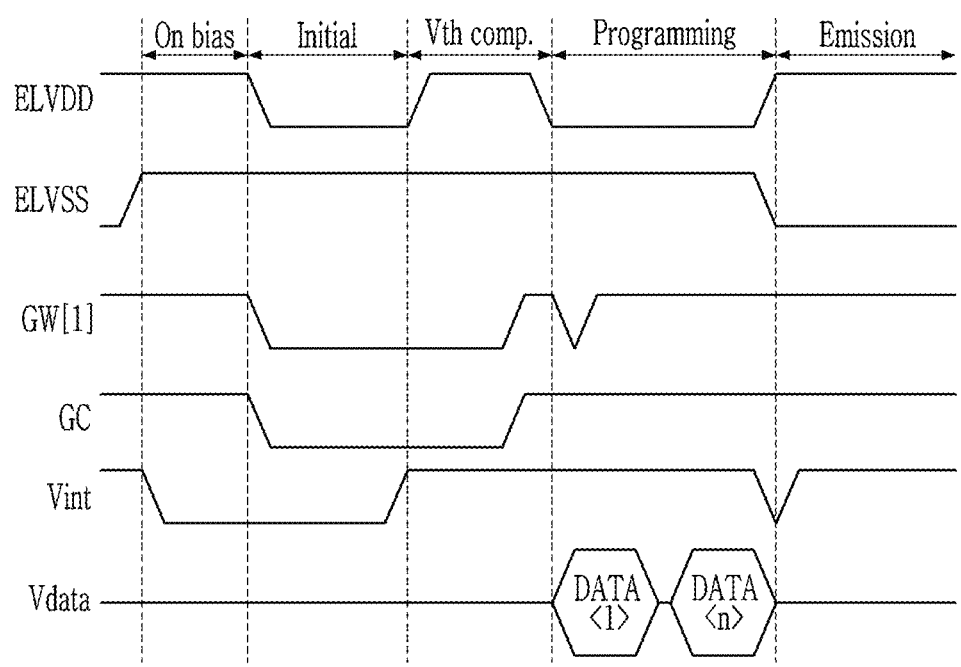
FIG. 30 is a timing diagram of a signal applied to a pixel of FIG. 29.

FIG. 29 is an equivalent circuit diagram of one pixel of an organic light emitting diode display according to another embodiment, and FIG. 30 is a timing diagram of a signal applied to a pixel of FIG. 29.

Comparing FIG. 29 with FIG. 1, there is no difference except that all the transistors T1, T2, and T3 are p-type transistors. However, comparing FIG. 30 with FIG. 2, there are many differences in the signal to be applied. Thus, the operation of the pixel in the case of using the p-type transistor is described in detail below with reference to FIG. 30.

The pixel of the organic light emitting diode display in an embodiment is divided into an initialization period (Initial), a threshold voltage compensation period (Vth Comp.), a programming period (Programming), and a light emission period (Emission) to be operated, and may further include an on-bias period (On bias) between the light emission period and the initialization period.

In the organic light emitting diode OLED that emits light during the light emission period (Emission), as the current does not flow to the cathode side from the anode of the organic light emitting diode OLED while the voltage of the second driving voltage ELVSS applied to the other side electrode of the organic light emitting diode OLED is changed into the high voltage, the light emission period (Emission) is ended.

Thereafter, the initialization voltage Vint is changed from the high voltage to the low voltage and enters the on-bias period. When the voltage of the second electrode of the storage capacitor Cst to which the initialization voltage Vint is applied is changed to the low voltage, the voltage of the first electrode of the storage capacitor Cst, that is, the gate electrode of the driving transistor T1, is also lowered. As a result, the output of the driving transistor T1 may increase for a time. However, since the second driving voltage ELVSS has a high voltage and a forward current does not flow to the organic light emitting diode OLED, the organic light emitting diode OLED does not emit light. Such an on-bias period is a period having a characteristic of preparing an initialization period.

Thereafter, the initial period (Initial) is entered, and the initial period changes the scan signal GW applied to the scan line 142 and the control signal GC applied to the control signal line 143 into the low voltage, and starts while also changing the first driving voltage ELVDD into the low voltage. At this time, the initialization voltage Vint maintains the low voltage in the same way as in the on-bias period.

Since the second transistor T2 and the third transistor T3 are the p-type transistors, the low voltage applied to the scan line 142 and the control signal line 143 operates as a turn-on voltage such that the second transistor T2 and the third transistor T3 are turned on. In addition, as the first driving voltage ELVDD applied to the first electrode of the driving transistor T1 also drops to the low voltage, the voltage of the gate electrode of the driving transistor T1 also decreases. The gate electrode of the driving transistor T1 is already lowered once as the initialization voltage Vint decreases during the on-bias period, and additionally has a lower value. In this case, when the voltage of the gate electrode of the driving transistor T1 is a voltage for turning on the driving transistor T1, the voltage of the gate electrode of the driving transistor T1 is initialized while the charges accumulated in the first electrode of the storage capacitor Cst exit the first electrode of the driving transistor T1 after passing through the second transistor T2 and the third transistor T3 and finally has a voltage value corresponding to the low voltage value of the first driving voltage ELVDD, and the driving transistor T1 is turned off. In this case, the second electrode (the anode electrode) of the driving transistor T1, the first electrode of the storage capacitor Cst, and the first electrode of the input capacitor Cpr are connected to each other and initialized to the same voltage. When a voltage value of the voltage of the gate electrode of the driving transistor T1 is not lower than a voltage value of the low voltage of the first driving voltage ELVDD, the second transistor T2 and the third transistor T3 are turned on such that the second electrode (the anode electrode) of the driving transistor T1, the first electrode of the storage capacitor Cst, and the first electrode of the input capacitor Cpr are connected to each other and initialized to the same voltage. As described above, the same voltage of the second electrode (the anode electrode) of the driving transistor T1, the first electrode of the storage capacitor Cst, and the first electrode of the input capacitor Cpr through the initialization is also referred to as a connection voltage hereinafter.

At this time, since the low voltage of the first driving voltage ELVDD has a voltage value lower than a voltage value of the high voltage of the second driving voltage ELVSS, the forward current does not flow to the organic light emitting diode OLED, and the organic light emitting diode OLED does not emit light.

Thereafter, the initialization voltage Vint is changed to a high voltage and the initialization period ends. At this time, the voltage of the first electrode of the storage capacitor Cst has a higher value than the connection voltage value, which is an initialized voltage, and a voltage value of the voltage of the gate electrode of the driving transistor T1 is higher than that of the first electrode, thereby the driving transistor T1 maintains the turned off state.

Thereafter, the threshold voltage compensation period (Vth Comp.) is performed while the first driving voltage ELVDD is changed to the high voltage.

When the voltage applied to the first electrode of the driving transistor T1 is changed to the high voltage, the voltage of the gate electrode of the driving transistor T1 increases, but has a smaller value than a voltage value of the voltage of the first electrode by the threshold voltage of the driving transistor T1 or more such that the drive transistor T1 is turned on. At this time, since the third transistor T3 and the second transistor T2 are in the turned-on state, the driving transistor T1 has the diode-connected structure. Due to the connection, the output of the driving transistor T1 is transmitted to the gate electrode of the driving transistor T1, and the voltage of the gate electrode is increased. When the gradually rising voltage of the gate electrode is increased to the value that is smaller than the value of the voltage of the first electrode of the driving transistor T1, that is, the high voltage value of the first driving voltage ELVDD by the threshold voltage of the driving transistor T1, the driving transistor T1 is turned off. The voltage at this time is stored in the first electrode of the storage capacitor Cst, and the voltage has the value ELVDD_H−Vth when the high voltage value of the first driving voltage ELVDD is referred to as ELVDD_H and the threshold voltage value is referred to as Vth. Since the second transistor T2 and the third transistor T3 are turned on, the voltage stored in the first electrode of the storage capacitor Cst is the same as the voltage of the anode and the voltage of the first electrode of the input capacitor Cpr.

Thereafter, the scan signal GW applied to the scan line 142 and the control signal GC applied to the control signal line 143 are both changed to the high voltage, and the second transistor T2 and the third transistor T3 are turned off. As a result, the first electrode of the storage capacitor Cst, the anode electrode, and the first electrode of the input capacitor Cpr are electrically separated from each other.

Thereafter, the threshold voltage compensation period ends while changing the first driving voltage ELVDD to a low voltage. When the first driving voltage ELVDD is changed to the low voltage, the voltage of the first electrode of the storage capacitor Cst is lowered, but not low enough to turn on the driving transistor T1.

In this case, since the second driving voltage ELVSS of the organic light emitting diode OLED has the high voltage, no current flows to the organic light emitting diode OLED.

Thereafter, the programming period starts, and the scan signal GW having the turn-on voltage (the low voltage) value is sequentially applied to the scan line 142 in the programming period.

In the programming period, when the second transistor T2 is turned on, the data voltage of the data voltage input terminal is transmitted to the first electrode of the storage capacitor Cst and stored therein. In this case, the data voltage of the data voltage input terminal as the voltage transmitted from the data line 171 through the input capacitor Cpr may have the voltage value lower than a voltage value of the data voltage Vdata applied from the data line 171. This voltage is transmitted to the first electrode of the storage capacitor Cst and stored therein. However, since the first driving voltage ELVDD has the low voltage, the driving transistor T1 does not operate.

Although not shown in FIG. 30, the programming period of FIG. 30 also includes the holding period as shown in FIG. 2, and the holding period as a period before and after the scan signal GW applies the turn-on voltage is a different holding period for each scan line 142. The holding period refers to a period in which the voltages of the storage capacitor Cst and the other terminals are maintained.

When the data voltage of the data voltage input terminal is stored in the storage capacitors Cst through the first electrode of all the pixels, while the first driving voltage ELVDD is changed again to the high voltage, and the second driving voltage ELVSS is changed again to the low voltage, the emission period (Emission) is entered.

In the embodiment of FIG. 30, an operation of lowering the initialization voltage Vint to the low voltage and then changing the initialization voltage Vint to the high voltage when entering the emission period is further included. This is to eliminate the problem that the organic light emitting diode OLED may emit light while the driving transistor T1 outputs the output current in the middle of the fluctuation of the first driving voltage ELVDD and the second driving voltage ELVSS. That is, after the voltages of the first driving voltage ELVDD and the second driving voltage ELVSS are changed to the high voltage and the low voltage, respectively, the initializing voltage Vint is raised to the high voltage such that the driving transistor T1 outputs the current and the timing at which the organic light emitting diode OLED emits light is determined. As a result, the unnecessary luminance is not displayed. In addition, the variation of the initialization voltage Vint may serve to set the black voltage of the organic light emitting diode OLED. That is, in the period in which the first driving voltage ELVDD and the second driving voltage ELVSS fluctuate, the driving transistor T1 may generate the output current, but a current value of the output current is substantially small, so that the anode voltage increases accordingly, and thus the problem that the anode voltage is affected in the actual light emitting period may be generated. In order to eliminate this problem and to prevent the anode voltage from being affected, the initialization voltage Vint may also be changed when the light emission period is entered.

In the embodiment, a change of the initialization voltage Vint when entering the light emitting period may not be included.

In the light emission period, all the pixels emit light at the same time for the same time duration. However, in an embodiment, some pixels may emit light.

In the description of FIG. 30, unlike FIG. 2, the detailed description of the voltage is omitted, but it has the same characteristics as the analysis of FIG. 2.

That is, in the threshold voltage compensation period, the output current value is determined only according to the data voltage Vdata by compensating the threshold voltage value of the driving transistor T1 stored in the first electrode of the storage capacitor Cst even when each driving transistor T1 has the different threshold voltage. As a result, the same luminance is emitted for the same data voltage so that the display quality does not deteriorate.

In addition, the value a, the value b, and the value c used in the equation of FIG. 2 may also be applied to FIG. 30, but may be neglected by designing the pixel to offset the values because the values are determined according to the overlapping area or the interval while designing the pixel.

While this disclosure has been described in connection with what is presently considered to be practical embodiments, it is to be understood that the invention is not limited to the disclosed embodiments. On the contrary, it is intended to cover various modifications and equivalent arrangements.

What is claimed is:

1. An organic light emitting diode display comprising:
   a substrate;
   a semiconductor pattern disposed on the substrate;
   a first conductive layer disposed on the semiconductor pattern and including a first gate electrode having an island-shaped structure, a second gate electrode having an island-shaped structure, and a third gate electrode having an island-shaped structure; and
   a second conductive layer disposed on the first conductive layer and including a first initialization voltage line overlapping the first gate electrode, a scan line overlapping the second gate electrode and a control signal line overlapping the third gate electrode,
   wherein the control signal line is electrically connected to the third gate electrode, the scan line is electrically connected to the second gate electrode, and
   the first initialization voltage line, the scan line, and the control signal line extend in a first direction.

2. The organic light emitting diode display of claim 1, further comprising:
   a third conductive layer disposed on the second conductive layer and including a data line extending in a second direction crossing the first direction; and
   a fourth conductive layer disposed on the third conductive layer and includes a first driving voltage line and a second initialization voltage line extending in the second direction.

3. The organic light emitting diode display of claim 2, wherein
   the second conductive layer further includes a connecting member,
   the semiconductor pattern includes a storage capacitor connection semiconductor, and
   the connecting member electrically connects the storage capacitor connection semiconductor of the semiconductor pattern and the first gate electrode.

4. The organic light emitting diode display of claim 3, wherein
   the semiconductor pattern further includes a lightly doped region, a heavily doped region, and a non-doped region, and
   the connecting member is in contact with the lightly doped region and the heavily doped region of the semiconductor pattern.

5. The organic light emitting diode display of claim 2, wherein
   the fourth conductive layer further includes a first electrode for an input capacitor,
   the data line includes an expansion part, and
   the first electrode for the input capacitor overlaps the expansion part of the data line to form the input capacitor.

6. The organic light emitting diode display of claim 5, wherein
   the semiconductor pattern further includes a data voltage input semiconductor, and
   the first electrode for the input capacitor is connected to the data voltage input semiconductor of the semiconductor pattern.

7. The organic light emitting diode display of claim 2, wherein
   the fourth conductive layer further includes an anode electrode connecting member,
   the semiconductor pattern includes an anode electrode connection semiconductor; and
   the anode electrode connecting member is electrically connected to the anode electrode connection semiconductor of the semiconductor pattern and an anode electrode.

8. The organic light emitting diode display of claim 2, wherein the first initialization voltage line and the second initialization voltage line are electrically connected to each other.

9. The organic light emitting diode display of claim 8, wherein
the first gate electrode and the first initialization voltage line overlap to form a storage capacitor.

10. The organic light emitting diode display of claim 1, wherein
the semiconductor pattern includes a heavily doped region which does not overlap the first conductive layer, and a non-doped region overlapping the first conductive layer.

11. The organic light emitting diode display of claim 2, wherein
the semiconductor pattern has a symmetrical structure with reference to the second direction, and a unit semiconductor pattern corresponds to two pixels.

12. The organic light emitting diode display of claim 11, wherein
the unit semiconductor pattern has one first driving voltage input semiconductor,
the first driving voltage input semiconductor is connected to the first driving voltage line, and
the first driving voltage line has a structure in which two adjacent pixel columns are shared.

13. An organic light emitting diode display comprising:
an organic light emitting element;
a first transistor which supplies a current to the organic light emitting element;
a storage capacitor connected to a gate electrode of the first transistor;
a second transistor and a third transistor connecting the organic light emitting element and the gate electrode of the first transistor;
a data line including an expansion part;
an input capacitor which transmits a data voltage from the data line between the second transistor and the third transistor; and
a first electrode for the input capacitor,
wherein the input capacitor is provided by the expansion part of the data line as a first input capacitor electrode and the first electrode for the input capacitor disposed on the expansion part of the data line and overlapping the expansion part of the data line as a second input capacitor electrode.

14. The organic light emitting diode display of claim 13, further comprising a storage capacitor provided by the gate electrode of the first transistor as a first storage capacitor electrode and a first initialization voltage line to which an initialization voltage is applied as a second storage capacitor electrode.

15. The organic light emitting diode display of claim 14, wherein
a gate electrode of the second transistor receives a scan signal,
a gate electrode of the third transistor receives a control signal,
the first electrode of the first transistor receives a first driving voltage, and
a cathode of the organic light emitting element receives a second driving voltage.

16. The organic light emitting diode display of claim 15, wherein
an initialization period, a threshold voltage compensation period, a programming period, and a light emission period are included, and
the second transistor and the third transistor are turned on in the initialization period and the threshold voltage compensation period.

17. The organic light emitting diode display of claim 16, wherein
the first driving voltage includes a high voltage having a high voltage value, a first low voltage having a first low voltage value, and a second low voltage having a second low voltage value which is lower than the first low voltage value,
the first low voltage is applied as the first driving voltage in the initialization period,
the second low voltage is applied as the first driving voltage in the threshold voltage compensation period, and
the high voltage is applied as the first driving voltage in the programming period and the light emission period.

18. The organic light emitting diode display of claim 17, wherein
the initialization voltage includes a low voltage and a high voltage, and
the initialization voltage is changed from the low voltage to the high voltage and starts in the light emission period.

19. The organic light emitting diode display of claim 18, wherein
the low voltage is applied as the initialization voltage in the threshold voltage compensation period.

* * * * *